United States Patent
Zagalsky et al.

(10) Patent No.: US 12,301,256 B2
(45) Date of Patent: May 13, 2025

(54) RESOURCE EFFICIENT LIST DECODING OPERATIONS

(71) Applicant: Qualcomm Incorporated, San Diego, CA (US)

(72) Inventors: Yevgeny Zagalsky, Karmey Yosef (IL); Peer Berger, Hod Hasharon (IL); Ran Berliner, Kfar Aviv (IL); Shay Landis, Hod Hasharon (IL); Eitan Yerushalmi, Tel Aviv (IL); David Jacobian, Herzliya (IL)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/234,824

(22) Filed: Aug. 16, 2023

(65) Prior Publication Data

US 2025/0062780 A1 Feb. 20, 2025

(51) Int. Cl.
*H03M 13/15* (2006.01)
*H03M 13/11* (2006.01)
*H03M 13/41* (2006.01)

(52) U.S. Cl.
CPC ... *H03M 13/1555* (2013.01); *H03M 13/1125* (2013.01); *H03M 13/4115* (2013.01)

(58) Field of Classification Search
CPC ......... H03M 13/1555; H03M 13/1125; H03M 13/4115
See application file for complete search history.

(56) References Cited

U.S. PATENT DOCUMENTS

| | | | | |
|---|---|---|---|---|
| 2018/0083733 A1* | 3/2018 | Chen | ..................... | H04L 1/0048 |
| 2020/0358555 A1* | 11/2020 | Chen | ..................... | H04L 1/0042 |
| 2021/0112398 A1* | 4/2021 | Mishra | .................. | H04W 8/205 |

FOREIGN PATENT DOCUMENTS

WO 2020062061 A1 4/2020

OTHER PUBLICATIONS

International Search Report and Written Opinion issued in PCT/US2024/040417, mailed Nov. 19, 2024, EPO, 12 pages.
Mondelli, M., et al., "Capacity-Achieving Rate-Compatible Polar Codes for General Channels," IEEE Wireless Communications and Networking Conference Workshops (WCNCW), Mar. 19, 2017, pp. 1-6.
Qualcomm Inc., "FRANK Polar Construction for NR Control Channel and Performance Comparison," 3GPP TSG-RAN WG1 #89, R1-1709178, May 17, 2017, pp. 1-27.

* cited by examiner

*Primary Examiner* — Thien Nguyen
(74) *Attorney, Agent, or Firm* — Dinsmore & Shohl LLP

(57) ABSTRACT

Certain aspects of the present disclosure provide techniques for Aspects of the present disclosure relate to wireless communications, and more particularly, to techniques for determining a minimal list size to use in list decoding operations for reducing resource consumption (e.g., compute, memory, and power) at a decoder. A method includes receiving a codeword comprising a plurality of channel bits encoded with an error-correcting code, the plurality of channel bits comprising, at least, a plurality of information bits, determining a payload size of the codeword, determining a channel capacity metric for the plurality of channel bits, determining a minimal list size for a list decoding operation based on at least the payload size and the channel capacity metric; and performing the list decoding operation on the codeword based on the minimal list size to obtain the plurality of information bits.

20 Claims, 11 Drawing Sheets

650

| Polar Size | Payload (Bits) | List | Decoder Cycles |
|---|---|---|---|
| 128 | 60 | 1 | 464 |
| 128 | 60 | 8 | 942 |
| 256 | 60 | 1 | 541 |
| 256 | 60 | 8 | 1173 |
| 512 | 60 | 1 | 656 |
| 512 | 60 | 8 | 1461 |
| 512 | 60 | 1 | 656 |

*FIG. 6B*

RESOURCE EFFICIENT LIST DECODING OPERATIONS

BACKGROUND

Field of the Disclosure

Aspects of the present disclosure relate to wireless communications, and more particularly, to techniques for determining a minimal list size to use in list decoding operations for reducing resource consumption (e.g., compute, memory, and power) at a decoder.

Description of Related Art

Wireless communications systems are widely deployed to provide various telecommunication services such as telephony, video, data, messaging, broadcasts, or other similar types of services. These wireless communications systems may employ multiple-access technologies capable of supporting communications with multiple users by sharing available wireless communications system resources with those users.

Although wireless communications systems have made great technological advancements over many years, challenges still exist. For example, complex and dynamic environments can still attenuate or block signals between wireless transmitters and wireless receivers. Accordingly, there is a continuous desire to improve the technical performance of wireless communications systems, including, for example: improving speed and data carrying capacity of communications, improving efficiency of the use of shared communications mediums, reducing power used by transmitters and receivers while performing communications, improving reliability of wireless communications, avoiding redundant transmissions and/or receptions and related processing, improving the coverage area of wireless communications, increasing the number and types of devices that can access wireless communications systems, increasing the ability for different types of devices to intercommunicate, increasing the number and type of wireless communications mediums available for use, and the like. Consequently, there exists a need for further improvements in wireless communications systems to overcome the aforementioned technical challenges and others.

SUMMARY

One aspect provides a method for wireless communications by an apparatus. The method includes receiving a codeword comprising a plurality of channel bits encoded with an error-correcting code, the plurality of channel bits comprising, at least, a plurality of information bits; determining a payload size of the codeword; determining a channel capacity metric for the plurality of channel bits; determining a minimal list size for a list decoding operation based on at least the payload size and the channel capacity metric; and performing the list decoding operation on the codeword based on the minimal list size to obtain the plurality of information bits.

Other aspects provide: one or more apparatuses operable, configured, or otherwise adapted to perform any portion of any method described herein (e.g., such that performance may be by only one apparatus or in a distributed fashion across multiple apparatuses); one or more non-transitory, computer-readable media comprising instructions that, when executed by one or more processors of one or more apparatuses, cause the one or more apparatuses to perform any portion of any method described herein (e.g., such that instructions may be included in only one computer-readable medium or in a distributed fashion across multiple computer-readable media, such that instructions may be executed by only one processor or by multiple processors in a distributed fashion, such that each apparatus of the one or more apparatuses may include one processor or multiple processors, and/or such that performance may be by only one apparatus or in a distributed fashion across multiple apparatuses); one or more computer program products embodied on one or more computer-readable storage media comprising code for performing any portion of any method described herein (e.g., such that code may be stored in only one computer-readable medium or across computer-readable media in a distributed fashion); and/or one or more apparatuses comprising one or more means for performing any portion of any method described herein (e.g., such that performance would be by only one apparatus or by multiple apparatuses in a distributed fashion). By way of example, an apparatus may comprise a processing system, a device with a processing system, or processing systems cooperating over one or more networks.

The following description and the appended figures set forth certain features for purposes of illustration.

BRIEF DESCRIPTION OF DRAWINGS

The appended figures depict certain features of the various aspects described herein and are not to be considered limiting of the scope of this disclosure.

FIG. 6B is a graph depicting example performance of different list sized used for list decoding.

DETAILED DESCRIPTION

Figure 1:
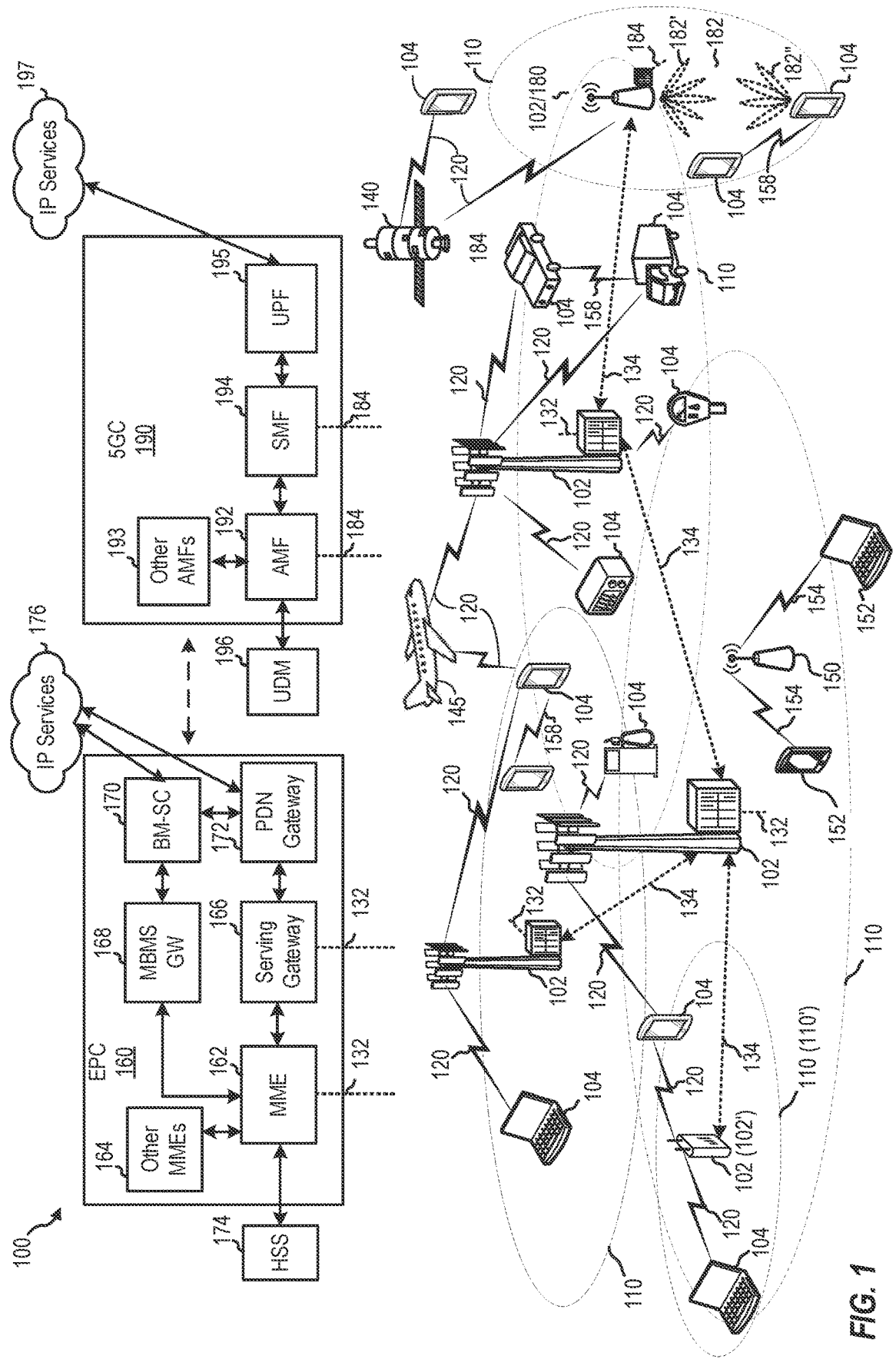
FIG. 1 depicts an example wireless communications network.

Aspects of the present disclosure relate to techniques for determining a minimal list size to use in list decoding operations for reducing resource consumption (e.g., compute, memory, and power) at a decoder.

In wireless communications, noise in a channel between a transmitter and a receiver may distort a message transmitted between the two. Reliable communication of information over such a noisy channel is a fundamental and challenging technical problem in this specific technical environment. Error-correcting codes (or simply referred to as "codes") are designed to mitigate this problem by providing a systematic way of adding redundancy to a message, such that a distorted message may nevertheless be decoded successfully by a receiver.

For example, a transmitter of a message comprising a plurality of information bits first encodes the message using an error-correcting code to produce a codeword having a plurality of encoded channel bits. The transmitter then transmits the resulting codeword to a receiver using a channel. The receiver may receive a distorted copy of the transmitted codeword due to noise on the channel. However, the receiver may nevertheless determine the original message using a decoding algorithm that takes advantage of the error-correcting encoding.

Traditionally, decoding algorithms were constrained to output a single, unique codeword. However, an alternative decoding method, referred to as "list decoding" outputs a list of possible codewords for a received codeword (e.g., a vector that may be a distorted version of the transmitted codeword) according to integer parameter L, which denotes a list size of possible codewords. The received codeword is considered to be list decoded correctly if the transmitted codeword is in the list of possible codewords.

A conventional method for determining a list size, L, for performing list decoding involves selecting a list size from a set of potential list sizes based on a performance metric determined for the selected list size. For example, a list size resulting in a smallest block error rate (BLER) (e.g., a ratio of a number of erroneous blocks to a total number of blocks transmitted) among BLERs for other list sizes may be selected. While determining a list size that maximizes reliability of communication (e.g., because a lower BLER is achieved) is desirable, this process may be resource intensive and time-consuming where there are many list sizes to consider. In some cases, a maximal list size available to a decoder is used as a default for various decoding operations. For example, where a decoder is capable of using a list size, L=1, 4, or 8, the decoder may determine to use a list size, L=8. Using a maximal list size increases the probability of a transmitted codeword being within a determined list of possible codewords; however, using a maximal list size may not always be justified. For example, as list size increases, so does computational complexity, resource usage, and power consumption at a receiver performing the list decoding operation. Thus, in scenarios where a BLER achieved using a smaller list size is insignificantly different than a BLER achieved using a maximal list size, it may be desirable to use the smaller list size.

Accordingly, aspects described herein provide a technical solution to the aforementioned technical problems associated with conventional methods for determining a list size, L, for list decoding operations. In particular, aspects described herein determine an optimal (e.g., minimal) list size, $L_{min}$, to be used for a list decoding operation based on (1) a payload size of a received codeword and (2) a channel capacity metric determined for the received codeword. As used herein, channel capacity refers to a maximal rate of reliable communication via a channel used to transmit a codeword. In some aspects, channel capacity is determined based on a maximum mutual information value identified for the codeword that identifies an amount of information a channel can transmit.

For example, in one aspect, a receiver receives a codeword having a plurality of channel bits encoded with an error-correcting code. The codeword includes a message intended for the receiver (e.g., a plurality of information bits). To decode the received codeword and thereby determine the message intended for the receiver (e.g., included in the received codeword), the receiver 704 performs a list decoding operation using a minimal list size, $L_{min}$. To determine the minimal list size, the receiver determines a payload size of the received codeword, determines a channel capacity metric for bits of the received codeword, and uses the payload size and channel capacity metric to identify the minimal list size. As described below, in some aspects, channel capacity metric ranges are defined for different list sizes available for different payload sizes, and a list size may be determined based on the calculated channel capacity metric being within a range of channel capacity metrics for the selected list size for the determine payload size.

Determining the minimal list size based on a payload size and a channel capacity metric beneficially improves communication reliability (e.g., based on BLER) while also reducing power consumption and resource usage at the receiver performing the list decoding according to the minimal list size. In particular, using a minimal list size likewise minimizes a minimal number of decoder cycles used by the receiver, which saves power at the receiver. For user equipments (UEs) implementing aspects described herein, the inherent power savings of reducing decoder cycles may beneficially extend the battery life of the mobile UEs. Moreover, the improved communication reliability reduces retransmissions and improves power efficiency and effective use of the spectrum at the network level.

Introduction to Wireless Communications Networks

The techniques and methods described herein may be used for various wireless communications networks. While aspects may be described herein using terminology commonly associated with 3G, 4G, and/or 5G wireless technologies, aspects of the present disclosure may likewise be applicable to other communications systems and standards not explicitly mentioned herein.

FIG. 1 depicts an example of a wireless communications network 100, in which aspects described herein may be implemented.

Generally, wireless communications network 100 includes various network entities (alternatively, network elements or network nodes). A network entity is generally a communications device and/or a communications function performed by a communications device (e.g., a user equipment (UE), a base station (BS), a component of a BS, a server, etc.). As such communications devices are part of wireless communications network 100, and facilitate wireless communications, such communications devices may be referred to as wireless communications devices. For example, various functions of a network as well as various devices associated with and interacting with a network may be considered network entities. Further, wireless communications network 100 includes terrestrial aspects, such as ground-based network entities (e.g., BSs 102), and non-terrestrial aspects, such as satellite 140 and aircraft 145, which may include network entities on-board (e.g., one or more BSs) capable of communicating with other network elements (e.g., terrestrial BSs) and UEs.

In the depicted example, wireless communications network 100 includes BSs 102, UEs 104, and one or more core networks, such as an Evolved Packet Core (EPC) 160 and 5G Core (5GC) network 190, which interoperate to provide communications services over various communications links, including wired and wireless links.

FIG. 1 depicts various example UEs 104, which may more generally include: a cellular phone, smart phone, session initiation protocol (SIP) phone, laptop, personal digital assistant (PDA), satellite radio, global positioning system, multimedia device, video device, digital audio player, camera, game console, tablet, smart device, wearable device, vehicle, electric meter, gas pump, large or small kitchen appliance, healthcare device, implant, sensor/actuator, display, internet of things (IoT) devices, always on (AON) devices, edge processing devices, or other similar devices. UEs 104 may also be referred to more generally as a mobile device, a wireless device, a station, a mobile station, a subscriber station, a mobile subscriber station, a mobile unit, a subscriber unit, a wireless unit, a remote unit, a remote device, an access terminal, a mobile terminal, a wireless terminal, a remote terminal, a handset, and others.

BSs 102 wirelessly communicate with (e.g., transmit signals to or receive signals from) UEs 104 via communications links 120. The communications links 120 between BSs 102 and UEs 104 may include uplink (UL) (also referred to as reverse link) transmissions from a UE 104 to a BS 102 and/or downlink (DL) (also referred to as forward link) transmissions from a BS 102 to a UE 104. The communications links 120 may use multiple-input and multiple-output (MIMO) antenna technology, including spatial multiplexing, beamforming, and/or transmit diversity in various aspects.

BSs 102 may generally include: a NodeB, enhanced NodeB (eNB), next generation enhanced NodeB (ng-eNB), next generation NodeB (gNB or gNodeB), access point, base transceiver station, radio base station, radio transceiver, transceiver function, transmission reception point, and/or others. Each of BSs 102 may provide communications coverage for a respective coverage area 110, which may sometimes be referred to as a cell, and which may overlap in some cases (e.g., small cell 102' may have a coverage area 110' that overlaps the coverage area 110 of a macro cell). A BS may, for example, provide communications coverage for a macro cell (covering relatively large geographic area), a pico cell (covering relatively smaller geographic area, such as a sports stadium), a femto cell (relatively smaller geographic area (e.g., a home)), and/or other types of cells.

Generally, a cell may refer to a portion, partition, or segment of wireless communication coverage served by a network entity within a wireless communication network. A cell may have geographic characteristics, such as a geographic coverage area, as well as radio frequency characteristics, such as time and/or frequency resources dedicated to the cell. For example, a specific geographic coverage area may be covered by multiple cells employing different frequency resources (e.g., bandwidth parts) and/or different time resources. As another example, a specific geographic coverage area may be covered by a single cell.

Figure 2:
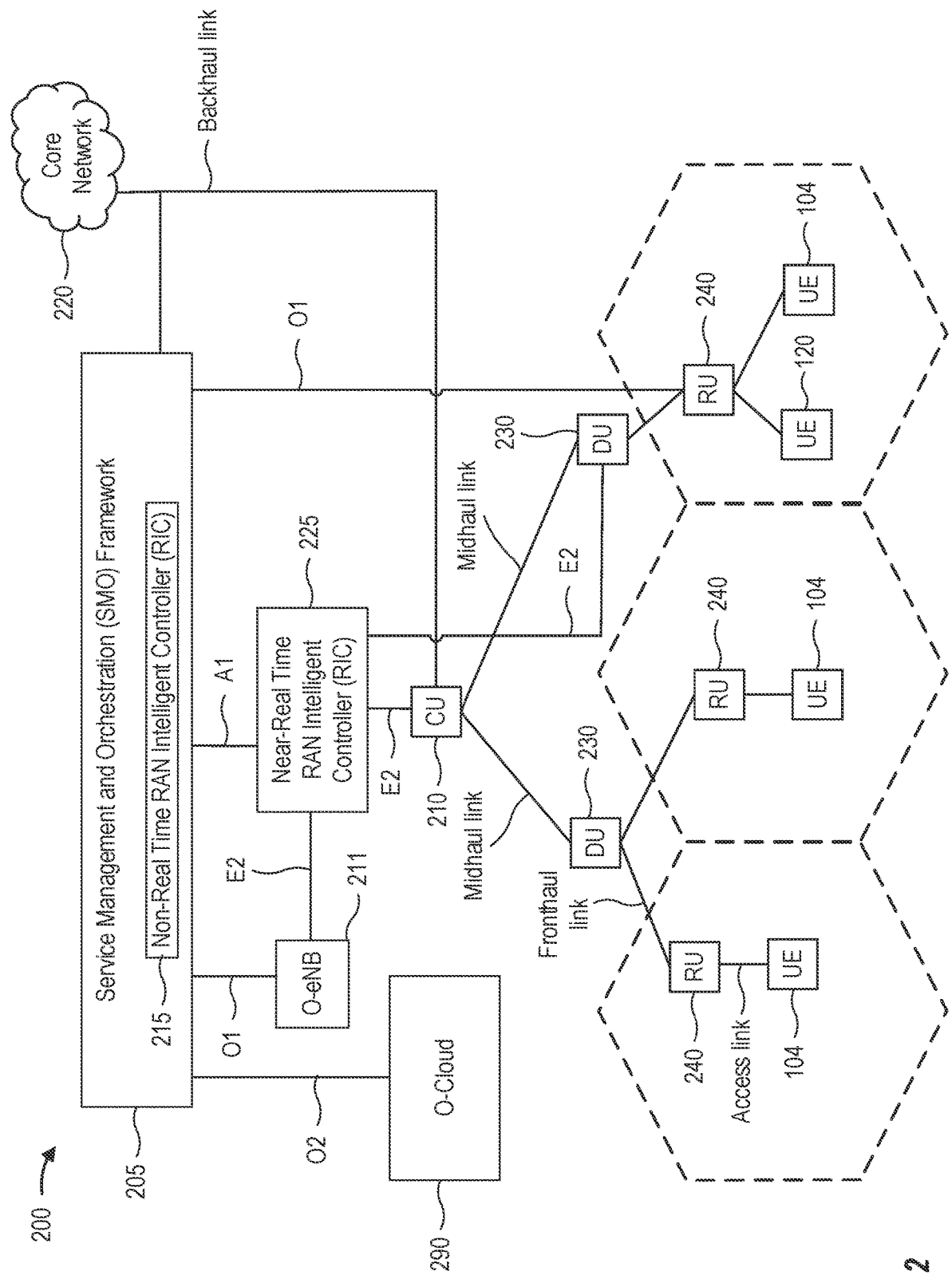
FIG. 2 depicts an example disaggregated base station architecture.

While BSs 102 are depicted in various aspects as unitary communications devices, BSs 102 may be implemented in various configurations. For example, one or more components of a base station may be disaggregated, including a central unit (CU), one or more distributed units (DUs), one or more radio units (RUs), a Near-Real Time (Near-RT) RAN Intelligent Controller (RIC), or a Non-Real Time (Non-RT) RIC, to name a few examples. In another example, various aspects of a base station may be virtualized. More generally, a base station (e.g., BS 102) may include components that are located at a single physical location or components located at various physical locations. In examples in which a base station includes components that are located at various physical locations, the various components may each perform functions such that, collectively, the various components achieve functionality that is similar to a base station that is located at a single physical location. In some aspects, a base station including components that are located at various physical locations may be referred to as a disaggregated radio access network architecture, such as an Open RAN (O-RAN) or Virtualized RAN (VRAN) architecture. FIG. 2 depicts and describes an example disaggregated base station architecture.

Different BSs 102 within wireless communications network 100 may also be configured to support different radio access technologies, such as 3G, 4G, and/or 5G. For example, BSs 102 configured for 4G LTE (collectively referred to as Evolved Universal Mobile Telecommunications System (UMTS) Terrestrial Radio Access Network (E-UTRAN)) may interface with the EPC 160 through first backhaul links 132 (e.g., an Si interface). BSs 102 configured for 5G (e.g., 5G NR or Next Generation RAN (NG-RAN)) may interface with 5GC 190 through second backhaul links 184. BSs 102 may communicate directly or indirectly (e.g., through the EPC 160 or 5GC 190) with each other over third backhaul links 134 (e.g., X2 interface), which may be wired or wireless.

Wireless communications network 100 may subdivide the electromagnetic spectrum into various classes, bands, channels, or other features. In some aspects, the subdivision is provided based on wavelength and frequency, where frequency may also be referred to as a carrier, a subcarrier, a frequency channel, a tone, or a subband. For example, 3GPP currently defines Frequency Range 1 (FR1) as including 410 MHz-7125 MHz, which is often referred to (interchangeably) as "Sub-6 GHz". Similarly, 3GPP currently defines Frequency Range 2 (FR2) as including 24,250 MHz-52,600 MHz, which is sometimes referred to (interchangeably) as a "millimeter wave" ("mmW" or "mmWave"). A base station configured to communicate using mmWave/near mmWave radio frequency bands (e.g., a mmWave base station such as BS 180) may utilize beamforming (e.g., 182) with a UE (e.g., 104) to improve path loss and range.

The communications links 120 between BSs 102 and, for example, UEs 104, may be through one or more carriers, which may have different bandwidths (e.g., 5, 10, 15, 20, 100, 400, and/or other MHz), and which may be aggregated in various aspects. Carriers may or may not be adjacent to each other. Allocation of carriers may be asymmetric with respect to DL and UL (e.g., more or fewer carriers may be allocated for DL than for UL).

Communications using higher frequency bands may have higher path loss and a shorter range compared to lower frequency communications. Accordingly, certain base stations (e.g., 180 in FIG. 1) may utilize beamforming 182 with a UE 104 to improve path loss and range. For example, BS 180 and the UE 104 may each include a plurality of antennas, such as antenna elements, antenna panels, and/or antenna arrays to facilitate the beamforming. In some cases, BS 180 may transmit a beamformed signal to UE 104 in one or more transmit directions 182'. UE 104 may receive the beamformed signal from the BS 180 in one or more receive directions 182". UE 104 may also transmit a beamformed signal to the BS 180 in one or more transmit directions 182". BS 180 may also receive the beamformed signal from UE 104 in one or more receive directions 182'. BS 180 and UE 104 may then perform beam training to determine the best receive and transmit directions for each of BS 180 and UE 104. Notably, the transmit and receive directions for BS 180 may or may not be the same. Similarly, the transmit and receive directions for UE 104 may or may not be the same.

Wireless communications network 100 further includes a Wi-Fi AP 150 in communication with Wi-Fi stations (STAs)

152 via communications links 154 in, for example, a 2.4 GHz and/or 5 GHz unlicensed frequency spectrum.

Certain UEs 104 may communicate with each other using device-to-device (D2D) communications link 158. D2D communications link 158 may use one or more sidelink channels, such as a physical sidelink broadcast channel (PSBCH), a physical sidelink discovery channel (PSDCH), a physical sidelink shared channel (PSSCH), a physical sidelink control channel (PSCCH), and/or a physical sidelink feedback channel (PSFCH).

EPC 160 may include various functional components, including: a Mobility Management Entity (MME) 162, other MMEs 164, a Serving Gateway 166, a Multimedia Broadcast Multicast Service (MBMS) Gateway 168, a Broadcast Multicast Service Center (BM-SC) 170, and/or a Packet Data Network (PDN) Gateway 172, such as in the depicted example. MME 162 may be in communication with a Home Subscriber Server (HSS) 174. MME 162 is the control node that processes the signaling between the UEs 104 and the EPC 160. Generally, MME 162 provides bearer and connection management.

Generally, user Internet protocol (IP) packets are transferred through Serving Gateway 166, which itself is connected to PDN Gateway 172. PDN Gateway 172 provides UE IP address allocation as well as other functions. PDN Gateway 172 and the BM-SC 170 are connected to IP Services 176, which may include, for example, the Internet, an intranet, an IP Multimedia Subsystem (IMS), a Packet Switched (PS) streaming service, and/or other IP services.

BM-SC 170 may provide functions for MBMS user service provisioning and delivery. BM-SC 170 may serve as an entry point for content provider MBMS transmission, may be used to authorize and initiate MBMS Bearer Services within a public land mobile network (PLMN), and/or may be used to schedule MBMS transmissions. MBMS Gateway 168 may be used to distribute MBMS traffic to the BSs 102 belonging to a Multicast Broadcast Single Frequency Network (MBSFN) area broadcasting a particular service, and/or may be responsible for session management (start/stop) and for collecting eMBMS related charging information.

5GC 190 may include various functional components, including: an Access and Mobility Management Function (AMF) 192, other AMFs 193, a Session Management Function (SMF) 194, and a User Plane Function (UPF) 195. AMF 192 may be in communication with Unified Data Management (UDM) 196.

AMF 192 is a control node that processes signaling between UEs 104 and 5GC 190. AMF 192 provides, for example, quality of service (QoS) flow and session management.

Internet protocol (IP) packets are transferred through UPF 195, which is connected to the IP Services 197, and which provides UE IP address allocation as well as other functions for 5GC 190. IP Services 197 may include, for example, the Internet, an intranet, an IMS, a PS streaming service, and/or other IP services.

In various aspects, a network entity or network node can be implemented as an aggregated base station, as a disaggregated base station, a component of a base station, an integrated access and backhaul (IAB) node, a relay node, a sidelink node, to name a few examples.

FIG. 2 depicts an example disaggregated base station 200 architecture. The disaggregated base station 200 architecture may include one or more central units (CUs) 210 that can communicate directly with a core network 220 via a backhaul link, or indirectly with the core network 220 through one or more disaggregated base station units (such as a Near-Real Time (Near-RT) RAN Intelligent Controller (RIC) 225 via an E2 link, or a Non-Real Time (Non-RT) RIC 215 associated with a Service Management and Orchestration (SMO) Framework 205, or both). A CU 210 may communicate with one or more distributed units (DUs) 230 via respective midhaul links, such as an F1 interface. The DUs 230 may communicate with one or more radio units (RUs) 240 via respective fronthaul links. The RUs 240 may communicate with respective UEs 104 via one or more radio frequency (RF) access links. In some implementations, the UE 104 may be simultaneously served by multiple RUs 240.

Each of the units, e.g., the CUs 210, the DUs 230, the RUs 240, as well as the Near-RT RICs 225, the Non-RT RICs 215 and the SMO Framework 205, may include one or more interfaces or be coupled to one or more interfaces configured to receive or transmit signals, data, or information (collectively, signals) via a wired or wireless transmission medium. Each of the units, or an associated processor or controller providing instructions to the communications interfaces of the units, can be configured to communicate with one or more of the other units via the transmission medium. For example, the units can include a wired interface configured to receive or transmit signals over a wired transmission medium to one or more of the other units. Additionally or alternatively, the units can include a wireless interface, which may include a receiver, a transmitter or transceiver (such as a radio frequency (RF) transceiver), configured to receive or transmit signals, or both, over a wireless transmission medium to one or more of the other units.

In some aspects, the CU 210 may host one or more higher layer control functions. Such control functions can include radio resource control (RRC), packet data convergence protocol (PDCP), service data adaptation protocol (SDAP), or the like. Each control function can be implemented with an interface configured to communicate signals with other control functions hosted by the CU 210. The CU 210 may be configured to handle user plane functionality (e.g., Central Unit-User Plane (CU-UP)), control plane functionality (e.g., Central Unit-Control Plane (CU-CP)), or a combination thereof. In some implementations, the CU 210 can be logically split into one or more CU-UP units and one or more CU-CP units. The CU-UP unit can communicate bidirectionally with the CU-CP unit via an interface, such as the E1 interface when implemented in an O-RAN configuration. The CU 210 can be implemented to communicate with the DU 230, as necessary, for network control and signaling.

The DU 230 may correspond to a logical unit that includes one or more base station functions to control the operation of one or more RUs 240. In some aspects, the DU 230 may host one or more of a radio link control (RLC) layer, a medium access control (MAC) layer, and one or more high physical (PHY) layers (such as modules for forward error correction (FEC) encoding and decoding, scrambling, modulation and demodulation, or the like) depending, at least in part, on a functional split, such as those defined by the 3$^{rd}$ Generation Partnership Project (3GPP). In some aspects, the DU 230 may further host one or more low PHY layers. Each layer (or module) can be implemented with an interface configured to communicate signals with other layers (and modules) hosted by the DU 230, or with the control functions hosted by the CU 210.

Lower-layer functionality can be implemented by one or more RUs 240. In some deployments, an RU 240, controlled by a DU 230, may correspond to a logical node that hosts RF processing functions, or low-PHY layer functions (such as performing fast Fourier transform (FFT), inverse FFT (iFFT), digital beamforming, physical random access channel (PRACH) extraction and filtering, or the like), or both, based at least in part on the functional split, such as a lower layer functional split. In such an architecture, the RU(s) 240 can be implemented to handle over the air (OTA) communications with one or more UEs 104. In some implementations, real-time and non-real-time aspects of control and user plane communications with the RU(s) 240 can be controlled by the corresponding DU 230. In some scenarios, this configuration can enable the DU(s) 230 and the CU 210 to be implemented in a cloud-based RAN architecture, such as a vRAN architecture.

The SMO Framework 205 may be configured to support RAN deployment and provisioning of non-virtualized and virtualized network elements. For non-virtualized network elements, the SMO Framework 205 may be configured to support the deployment of dedicated physical resources for RAN coverage requirements which may be managed via an operations and maintenance interface (such as an O1 interface). For virtualized network elements, the SMO Framework 205 may be configured to interact with a cloud computing platform (such as an open cloud (O-Cloud) 290) to perform network element life cycle management (such as to instantiate virtualized network elements) via a cloud computing platform interface (such as an O2 interface). Such virtualized network elements can include, but are not limited to, CUs 210, DUs 230, RUs 240 and Near-RT RICs 225. In some implementations, the SMO Framework 205 can communicate with a hardware aspect of a 4G RAN, such as an open eNB (O-eNB) 211, via an O1 interface. Additionally, in some implementations, the SMO Framework 205 can communicate directly with one or more RUs 240 via an O1 interface. The SMO Framework 205 also may include a Non-RT RIC 215 configured to support functionality of the SMO Framework 205.

The Non-RT RIC 215 may be configured to include a logical function that enables non-real-time control and optimization of RAN elements and resources, Artificial Intelligence/Machine Learning (AI/ML) workflows including model training and updates, or policy-based guidance of applications/features in the Near-RT RIC 225. The Non-RT RIC 215 may be coupled to or communicate with (such as via an A1 interface) the Near-RT RIC 225. The Near-RT RIC 225 may be configured to include a logical function that enables near-real-time control and optimization of RAN elements and resources via data collection and actions over an interface (such as via an E2 interface) connecting one or more CUs 210, one or more DUs 230, or both, as well as an O-eNB, with the Near-RT RIC 225.

In some implementations, to generate AI/ML models to be deployed in the Near-RT RIC 225, the Non-RT RIC 215 may receive parameters or external enrichment information from external servers. Such information may be utilized by the Near-RT RIC 225 and may be received at the SMO Framework 205 or the Non-RT RIC 215 from non-network data sources or from network functions. In some examples, the Non-RT RIC 215 or the Near-RT RIC 225 may be configured to tune RAN behavior or performance. For example, the Non-RT RIC 215 may monitor long-term trends and patterns for performance and employ AI/ML models to perform corrective actions through the SMO Framework 205 (such as reconfiguration via O1) or via creation of RAN management policies (such as A1 policies).

Figure 3:
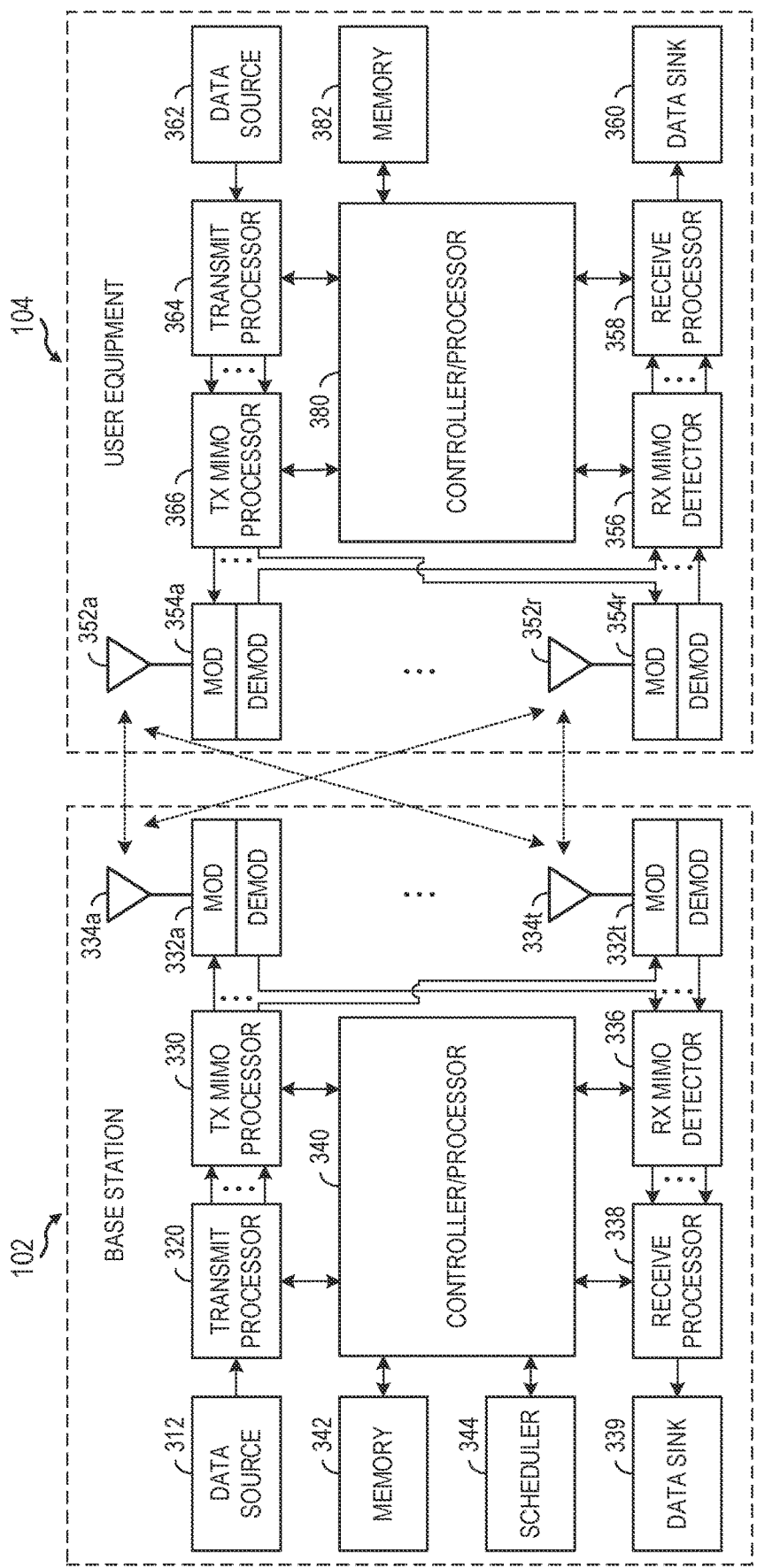
FIG. 3 depicts aspects of an example base station and an example user equipment.

FIG. 3 depicts aspects of an example BS 102 and a UE 104.

Generally, BS 102 includes various processors (e.g., 320, 330, 338, and 340), antennas 334a-t (collectively 334), transceivers 332a-t (collectively 332), which include modulators and demodulators, and other aspects, which enable wireless transmission of data (e.g., data source 312) and wireless reception of data (e.g., data sink 339). For example, BS 102 may send and receive data between BS 102 and UE 104. BS 102 includes controller/processor 340, which may be configured to implement various functions described herein related to wireless communications.

Generally, UE 104 includes various processors (e.g., 358, 364, 366, and 380), antennas 352a-r (collectively 352), transceivers 354a-r (collectively 354), which include modulators and demodulators, and other aspects, which enable wireless transmission of data (e.g., retrieved from data source 362) and wireless reception of data (e.g., provided to data sink 360). UE 104 includes controller/processor 380, which may be configured to implement various functions described herein related to wireless communications.

In regards to an example downlink transmission, BS 102 includes a transmit processor 320 that may receive data from a data source 312 and control information from a controller/processor 340. The control information may be for the physical broadcast channel (PBCH), physical control format indicator channel (PCFICH), physical hybrid automatic repeat request (HARQ) indicator channel (PHICH), physical downlink control channel (PDCCH), group common PDCCH (GC PDCCH), and/or others. The data may be for the physical downlink shared channel (PDSCH), in some examples.

Transmit processor 320 may process (e.g., encode and symbol map) the data and control information to obtain data symbols and control symbols, respectively. Transmit processor 320 may also generate reference symbols, such as for the primary synchronization signal (PSS), secondary synchronization signal (SSS), PBCH demodulation reference signal (DMRS), and channel state information reference signal (CSI-RS).

Transmit (TX) multiple-input multiple-output (MIMO) processor 330 may perform spatial processing (e.g., precoding) on the data symbols, the control symbols, and/or the reference symbols, if applicable, and may provide output symbol streams to the modulators (MODs) in transceivers 332a-332t. Each modulator in transceivers 332a-332t may process a respective output symbol stream to obtain an output sample stream. Each modulator may further process (e.g., convert to analog, amplify, filter, and upconvert) the output sample stream to obtain a downlink signal. Downlink signals from the modulators in transceivers 332a-332t may be transmitted via the antennas 334a-334t, respectively.

In order to receive the downlink transmission, UE 104 includes antennas 352a-352r that may receive the downlink signals from the BS 102 and may provide received signals to the demodulators (DEMODs) in transceivers 354a-354r, respectively. Each demodulator in transceivers 354a-354r may condition (e.g., filter, amplify, downconvert, and digitize) a respective received signal to obtain input samples. Each demodulator may further process the input samples to obtain received symbols.

RX MIMO detector 356 may obtain received symbols from all the demodulators in transceivers 354a-354r, perform MIMO detection on the received symbols if applicable, and provide detected symbols. Receive processor 358 may process (e.g., demodulate, deinterleave, and decode) the detected symbols, provide decoded data for the UE 104 to a data sink 360, and provide decoded control information to a controller/processor 380.

In regards to an example uplink transmission, UE 104 further includes a transmit processor 364 that may receive and process data (e.g., for the PUSCH) from a data source 362 and control information (e.g., for the physical uplink control channel (PUCCH)) from the controller/processor 380. Transmit processor 364 may also generate reference symbols for a reference signal (e.g., for the sounding reference signal (SRS)). The symbols from the transmit processor 364 may be precoded by a TX MIMO processor 366 if applicable, further processed by the modulators in transceivers 354a-354r (e.g., for SC-FDM), and transmitted to BS 102.

At BS 102, the uplink signals from UE 104 may be received by antennas 334a-t, processed by the demodulators in transceivers 332a-332t, detected by a RX MIMO detector 336 if applicable, and further processed by a receive processor 338 to obtain decoded data and control information sent by UE 104. Receive processor 338 may provide the decoded data to a data sink 339 and the decoded control information to the controller/processor 340.

Memories 342 and 382 may store data and program codes for BS 102 and UE 104, respectively.

Scheduler 344 may schedule UEs for data transmission on the downlink and/or uplink.

In various aspects, BS 102 may be described as transmitting and receiving various types of data associated with the methods described herein. In these contexts, "transmitting" may refer to various mechanisms of outputting data, such as outputting data from data source 312, scheduler 344, memory 342, transmit processor 320, controller/processor 340, TX MIMO processor 330, transceivers 332a-t, antenna 334a-t, and/or other aspects described herein. Similarly, "receiving" may refer to various mechanisms of obtaining data, such as obtaining data from antennas 334a-t, transceivers 332a-t, RX MIMO detector 336, controller/processor 340, receive processor 338, scheduler 344, memory 342, and/or other aspects described herein.

In various aspects, UE 104 may likewise be described as transmitting and receiving various types of data associated with the methods described herein. In these contexts, "transmitting" may refer to various mechanisms of outputting data, such as outputting data from data source 362, memory 382, transmit processor 364, controller/processor 380, TX MIMO processor 366, transceivers 354a-t, antenna 352a-t, and/or other aspects described herein. Similarly, "receiving" may refer to various mechanisms of obtaining data, such as obtaining data from antennas 352a-t, transceivers 354a-t, RX MIMO detector 356, controller/processor 380, receive processor 358, memory 382, and/or other aspects described herein.

In some aspects, a processor may be configured to perform various operations, such as those associated with the methods described herein, and transmit (output) to or receive (obtain) data from another interface that is configured to transmit or receive, respectively, the data.

FIGS. 4A, 4B, 4C, and 4D depict aspects of data structures for a wireless communications network, such as wireless communications network 100 of FIG. 1.

Figure 4:
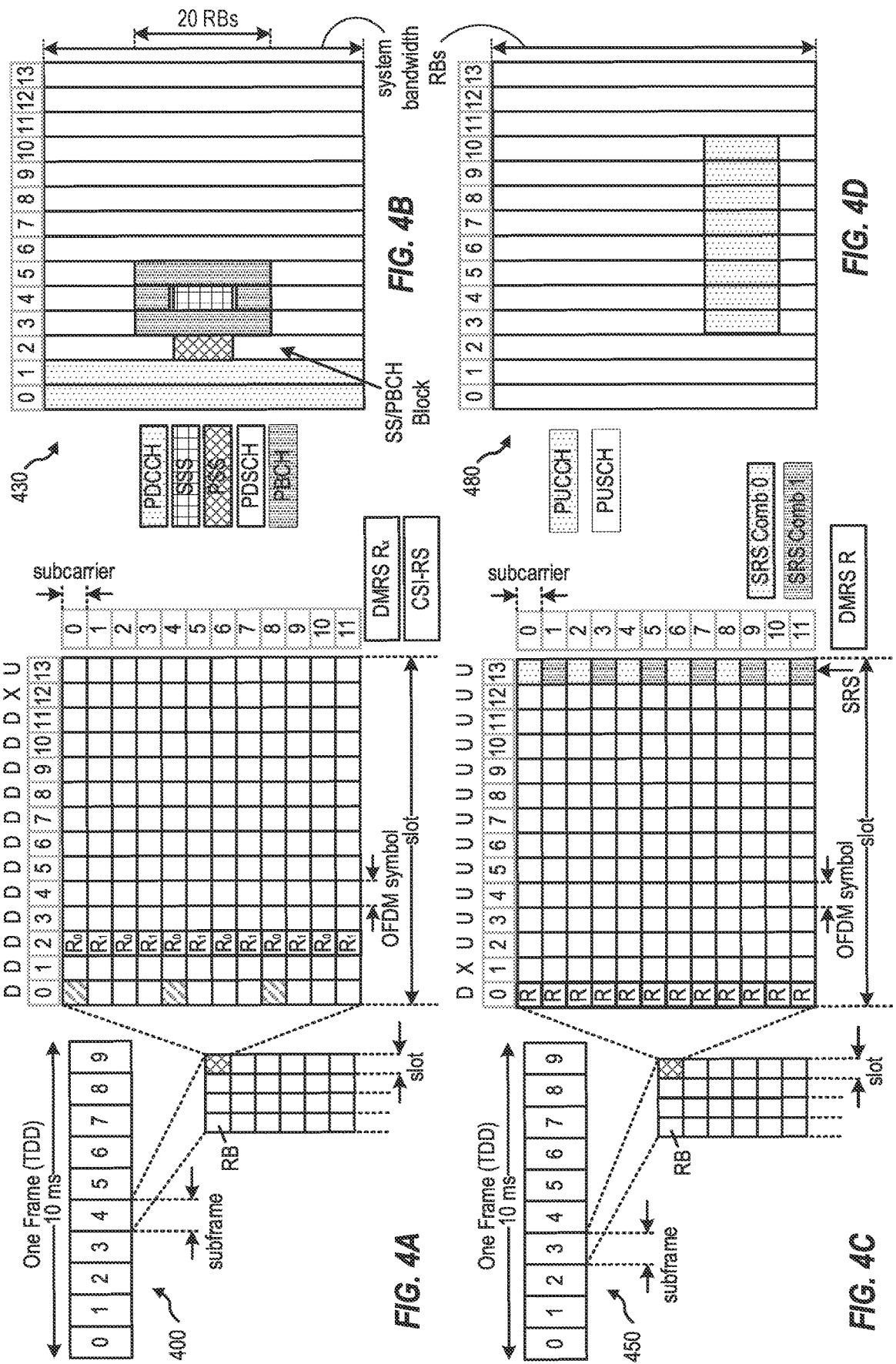
FIGS. 4A, 4B, 4C, and 4D depict various example aspects of data structures for a wireless communications network.

In particular, FIG. 4A is a diagram 400 illustrating an example of a first subframe within a 5G (e.g., 5G NR) frame structure, FIG. 4B is a diagram 430 illustrating an example of DL channels within a 5G subframe, FIG. 4C is a diagram 450 illustrating an example of a second subframe within a 5G frame structure, and FIG. 4D is a diagram 480 illustrating an example of UL channels within a 5G subframe.

Wireless communications systems may utilize orthogonal frequency division multiplexing (OFDM) with a cyclic prefix (CP) on the uplink and downlink. Such systems may also support half-duplex operation using time division duplexing (TDD). OFDM and single-carrier frequency division multiplexing (SC-FDM) partition the system bandwidth (e.g., as depicted in FIGS. 4B and 4D) into multiple orthogonal subcarriers. Each subcarrier may be modulated with data. Modulation symbols may be sent in the frequency domain with OFDM and/or in the time domain with SC-FDM.

A wireless communications frame structure may be frequency division duplex (FDD), in which, for a particular set of subcarriers, subframes within the set of subcarriers are dedicated for either DL or UL. Wireless communications frame structures may also be time division duplex (TDD), in which, for a particular set of subcarriers, subframes within the set of subcarriers are dedicated for both DL and UL.

In FIGS. 4A and 4C, the wireless communications frame structure is TDD where D is DL, U is UL, and X is flexible for use between DL/UL. UEs may be configured with a slot format through a received slot format indicator (SFI) (dynamically through DL control information (DCI), or semi-statically/statically through radio resource control (RRC) signaling). In the depicted examples, a 10 ms frame is divided into 10 equally sized 1 ms subframes. Each subframe may include one or more time slots. In some examples, each slot may include 7 or 14 symbols, depending on the slot format. Subframes may also include mini-slots, which generally have fewer symbols than an entire slot. Other wireless communications technologies may have a different frame structure and/or different channels.

In certain aspects, the number of slots within a subframe is based on a slot configuration and a numerology. For example, for slot configuration 0, different numerologies ($\mu$) 0 to 5 allow for 1, 2, 4, 8, 16, and 32 slots, respectively, per subframe. For slot configuration 1, different numerologies 0 to 2 allow for 2, 4, and 8 slots, respectively, per subframe. Accordingly, for slot configuration 0 and numerology $\mu$, there are 14 symbols/slot and $2\mu$ slots/subframe. The subcarrier spacing and symbol length/duration are a function of the numerology. The subcarrier spacing may be equal to $2^\mu \times 15$ kHz, where $\mu$ is the numerology 0 to 5. As such, the numerology $\mu=0$ has a subcarrier spacing of 15 kHz and the numerology $\mu=5$ has a subcarrier spacing of 480 kHz. The symbol length/duration is inversely related to the subcarrier spacing. FIGS. 4A, 4B, 4C, and 4D provide an example of slot configuration 0 with 14 symbols per slot and numerology $\mu=2$ with 4 slots per subframe. The slot duration is 0.25 ms, the subcarrier spacing is 60 kHz, and the symbol duration is approximately 16.67 µs.

As depicted in FIGS. 4A, 4B, 4C, and 4D, a resource grid may be used to represent the frame structure. Each time slot includes a resource block (RB)(also referred to as physical RBs (PRBs)) that extends, for example, 12 consecutive subcarriers. The resource grid is divided into multiple resource elements (REs). The number of bits carried by each RE depends on the modulation scheme.

As illustrated in FIG. 4A, some of the REs carry reference (pilot) signals (RS) for a UE (e.g., UE 104 of FIGS. 1 and 3). The RS may include demodulation RS (DMRS) and/or channel state information reference signals (CSI-RS) for channel estimation at the UE. The RS may also include beam measurement RS (BRS), beam refinement RS (BRRS), and/or phase tracking RS (PT-RS).

FIG. 4B illustrates an example of various DL channels within a subframe of a frame. The physical downlink control channel (PDCCH) carries DCI within one or more control channel elements (CCEs), each CCE including, for example, nine RE groups (REGs), each REG including, for example, four consecutive REs in an OFDM symbol.

A primary synchronization signal (PSS) may be within symbol 2 of particular subframes of a frame. The PSS is used by a UE (e.g., 104 of FIGS. 1 and 3) to determine subframe/symbol timing and a physical layer identity.

A secondary synchronization signal (SSS) may be within symbol 4 of particular subframes of a frame. The SSS is used by a UE to determine a physical layer cell identity group number and radio frame timing.

Based on the physical layer identity and the physical layer cell identity group number, the UE can determine a physical cell identifier (PCI). Based on the PCI, the UE can determine the locations of the aforementioned DMRS. The physical broadcast channel (PBCH), which carries a master information block (MLB), may be logically grouped with the PSS and SSS to form a synchronization signal (SS)/PBCH block. The MIB provides a number of RBs in the system bandwidth and a system frame number (SFN). The physical downlink shared channel (PDSCH) carries user data, broadcast system information not transmitted through the PBCH such as system information blocks (SIBs), and/or paging messages.

As illustrated in FIG. 4C, some of the REs carry DMRS (indicated as R for one particular configuration, but other DMRS configurations are possible) for channel estimation at the base station. The UE may transmit DMRS for the PUCCH and DMRS for the PUSCH. The PUSCH DMRS may be transmitted, for example, in the first one or two symbols of the PUSCH. The PUCCH DMRS may be transmitted in different configurations depending on whether short or long PUCCHs are transmitted and depending on the particular PUCCH format used. UE 104 may transmit sounding reference signals (SRS). The SRS may be transmitted, for example, in the last symbol of a subframe. The SRS may have a comb structure, and a UE may transmit SRS on one of the combs. The SRS may be used by a base station for channel quality estimation to enable frequency-dependent scheduling on the UL.

FIG. 4D illustrates an example of various UL channels within a subframe of a frame. The PUCCH may be located as indicated in one configuration. The PUCCH carries uplink control information (UCI), such as scheduling requests, a channel quality indicator (CQI), a precoding matrix indicator (PMI), a rank indicator (RI), and HARQ ACK/NACK feedback. The PUSCH carries data, and may additionally be used to carry a buffer status report (BSR), a power headroom report (PHR), and/or UCI.

Aspects Related to Forward Error Correction (FEC)

In wireless communication systems (e.g., such as wireless communications network 100 of FIG. 1), information may be represented as a sequence of binary bits (e.g., the smallest unit of information on a machine). For transmission of such information, the binary bits are mapped (e.g., modulated) to analog signal waveforms and transmitted over a channel. The communication channel may incur noise and/or interference that corrupts the transmitted signal. At a receiver, the transmitted signal is mapped back to the binary bits. The received binary information is an estimate of the transmitted binary information. However, bit errors may occur in the received binary information due to the noise and/or interference in the communication channel.

Channel coding, also referred to as forward error correction (FEC), may be used in communication systems to protect the transmitted information from channel noise and/or interference, and thus, enhance communication reliability. FEC may be accomplished by systematically adding redundant bits to a sequence of bits for transmission. These redundant bits may be referred to as an "error correcting code." The error correcting code allows for detection and correction of bit errors in the received codeword, and thus, allow for more reliable communications.

Error correcting codes for FEC can be broadly categorized into two types, namely, block codes and convolution codes. Block codes can be used to detect and/or correct errors. Block codes accept a block of k information bits (e.g., length of k information bits) and produce a block of n channel bits (also referred to as "coded bits"). By predetermined rules, n-k redundant bits are added to the k information bits to form the n channel bits. Commonly, these codes are referred to as (n,k) block codes. An example error-correction block code includes polar codes. Polar codes are efficient linear block code. Polar encoding (using polar codes) produces distinct locations in polar input, which have a greater probability of being decoded successfully (e.g., a high-reliability virtual channel), while other distinct locations in the input buffer are more likely to fail (e.g., more like to be erased by the channel, indicating a low-reliability virtual channel). As such, when using polar encoding the channel is polarized into high and low reliability virtual channels. In some cases, transmitted data is placed in the high-reliability locations, while pre-defined data values are placed in the low-reliability locations (referred to as "frozen bits"). Owing to good performance and low complexity, polar encoding is used in modern communication systems, such as wireless communications network 100 of FIG. 1.

Other examples of block codes include Hamming codes, Golay codes, Bose-Chaudhuri-Hocquenghem (BCH) codes, and Reed Solomon codes.

Unlike block codes, convolutional codes do not have a finite block length and instead may be considered as linear filters, such as infinite impulse response (IIR) or finite impulse response (FIR) filters. Convolutional codes are classified by two numbers, (A, B). A is the output bit count and B is the constraint length. More specifically, A counts the number of output transmit bits encoded for each input source bit, meaning that a convolutional code transmits source data at a rate of 1/A source bits per transmitted bits. B describes the amount of internal memory the encoder has, thereby impacting the complexity of decoding. An example convolutional code includes a viterbi code.

Aspects Related to List Decoding

Efficiently decoding a transmitted message (e.g., codeword) in the presence of channel-induced errors is an extant technical problem in communication systems. A naive decoding algorithm runs in exponential time to perform a decoding operation, and several classical polynomial time decoding algorithms are known for specific code families (e.g., block code family, convolution code family, etc.). Traditionally, however, these algorithms have been constrained to output a single, unique codeword.

An alternative decoding technique, referred to as "list decoding," allows a decoder to output a list of codewords that differ from a received codeword in a certain number of positions. List decoding is considered successful as long as the correct codeword is included in the list. Even when constrained to output a relatively small number of codewords, list decoding permits recovery from errors beyond the d/2 limitation of conventional decoding algorithms and allows for meaningful error-correction even in the presence of large amounts of noise and/or interference on a communication channel.

One example list decoding method includes successive cancellation list (SCL) decoding. SCL decoding uses an SCL decoder to determine a representation of an original message (e.g., information bits) from a received codeword encoded using an error-correcting code, such as a polar code. The SCL decoder is governed by a single integer parameter L, which denotes a list size. When performing SCL decoding, the SCL decoder decodes input bits successively one-by-one; however, L decoding paths are considered concurrently at each decoding stage.

Figure 5:
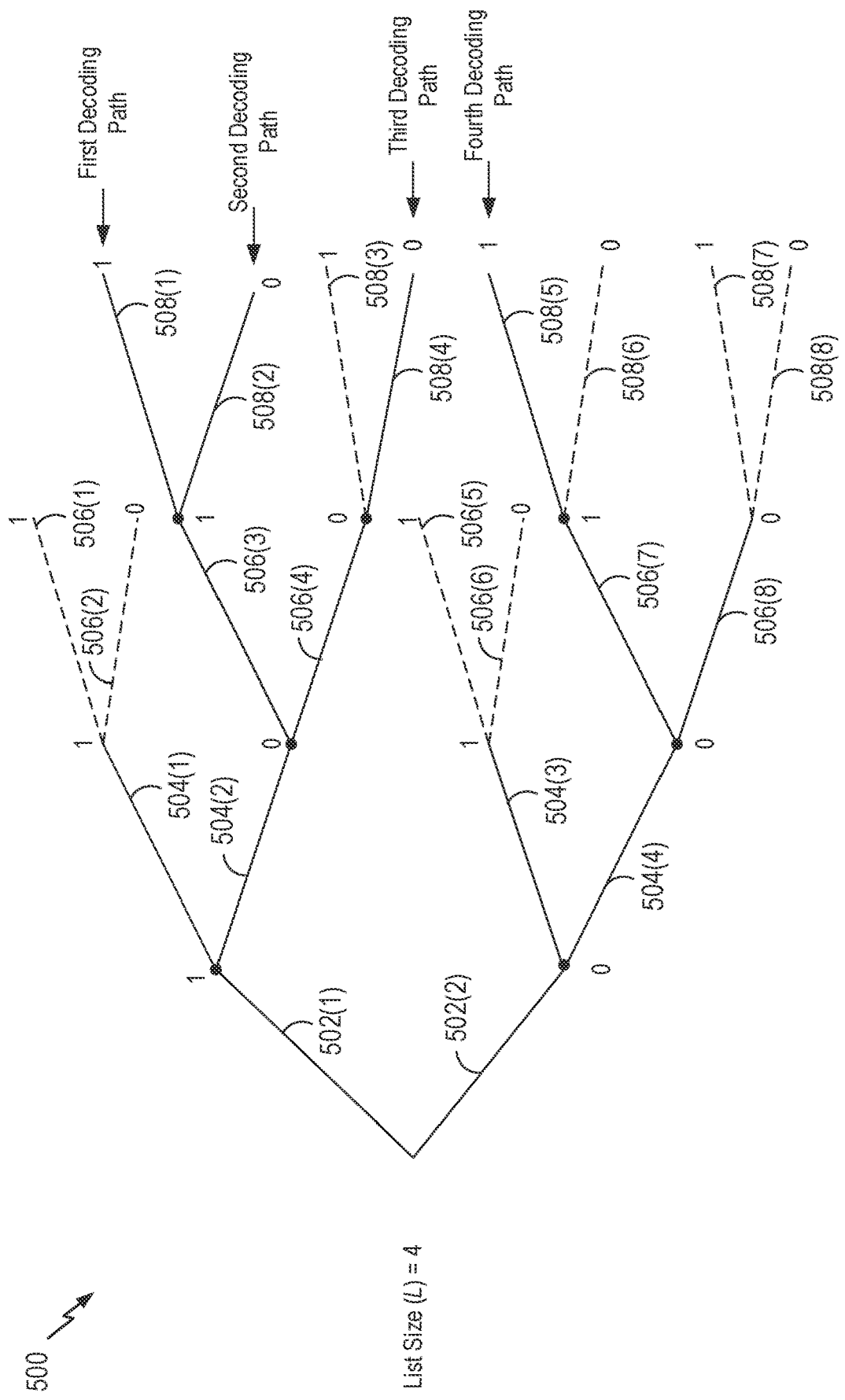
FIG. 5 depicts an example list decoding process.

FIG. 5 depicts an example list decoding process 500. List decoding process 500 may be performed by any receiver of a codeword comprising a plurality of channel bits encoded with an error-correcting code, such as a polar code. For example, the receiver may be a network entity (e.g., an example of the BS 102 depicted and described with respect to FIGS. 1 and 3 or a disaggregated BS depicted and described with respect to FIG. 2) or a UE (e.g., an example of UE 104 depicted and described with respect to FIGS. 1 and 3) implementing a list decoder. List decoding process 500 is represented by a binary tree, where each branch in the tree represents assigning a decoded bit for a decoding path. In some cases, each upwards branch may represent assigning a 1 bit, while the corresponding downward branch may represent assigning a 0 bit.

List decoding process 500 may be an example decoding process for a codeword encoded using a polar code. More specifically, the codeword may include channel bits encoded with a polar code, where the channel bits include a plurality of information bits.

In list decoding process 500, the receiver of the codeword uses a list mode decoder (e.g., an SCL decoder) to perform list decoding using a list size of L=4. As a list mode decoder of list size L=4, the list mode decoder may concurrently process (e.g., maintain after processing each information bit) four candidate decoding paths.

At a first level of list decoding process 500 (e.g., for a first bit in the codeword), the list mode decoder may track two decoding paths 502(1)-(2)(e.g., one path with a 1 bit value and one path with a 0 bit value). In some cases, this may not be the first bit of list decoding process 500 and may instead be the first information bit of the decoding process.

At a second level of list decoding process 500, the list mode decoder may split the two decoding paths 502(1)-(2) into four decoding paths 504(1)-(4) (e.g., corresponding to the decoded bit values 00, 01, 10, and 11).

At a third level of the decoding process, the list mode decoder may determine the four decoding paths 506(1)-(4) with the "best" (e.g., lowest) path metrics (e.g., such as a log likelihood (LL) and/or LLR). For example, based on the four decoding paths 504(1)-(4) at the second level, the list mode decoder has eight possible decoding paths 506(1)-(8) at the third level (e.g., corresponding to the decoded bit values 000, 001, 010, 011, 100, 101, 110, and 111). However, due to the list size of the list decoder (e.g., in this case, L=4), the list mode decoder may select four decoding paths most likely to be successful based on the calculated path metrics for each of these eight decoding paths 506(1)-(8), where the path metrics are calculated based on input log likelihood ratio (LLR) values for the received decoding candidate. As illustrated, decoding paths 506(3), 506(4), 506(7), and 506(8) containing the decoded bit values 101, 100, 001, and 000, respectively, correspond to the most reliable paths in this example (e.g., the paths with the lowest path metrics of the eight possible decoding paths 506(1)-(8)).

At a fourth level of the decoding process, the list mode decoder may again determine the four decoding paths 508 (e.g., decoding paths 508(1), 508(2), 508(4), and 508(5)) with the best (e.g., lowest) path metrics.

Selection of the list size, L, presents a difficult technical problem with significant performance consequences because the list size has a direct impact on computational complexity, resource usage, and power consumption at a receiver performing list decoding. Conventional methods of list decoding do not include an effective process for determining the value of L the best balances performance (e.g., maintaining a low block error rate (BLER) and resource utilization (e.g., compute, memory, and power). Conventional methods may derive the list size, L, experimentally, which may involve checking a large number of potential list sizes to find a "best" list size for a received codeword. Thus, conventional methods are time-consuming and resource intensive when there are many list size options to choose from.

Alternatively, in some conventional implementations, a list decoder is pre-configured with a conservative value of L to avoid the resource intensive process of experimentally deriving the list size. The value of L used to configure the list decoder may be selected such that a performance metric (e.g., a minimum threshold BLER) is always met regardless of a number of channel bits received for decoding, an error-correcting code size (e.g., a polar code size) used, etc.

In some cases, the conservative value of L is a maximal list size available for a list decoder. In other words, the list size, L, is selected irrespective of list decoder performance. In such cases, computation complexity, resource usage, and/or power consumption at a receiver performing the list decoding based on the maximal list size available may be unnecessarily high.

Figure 6A:
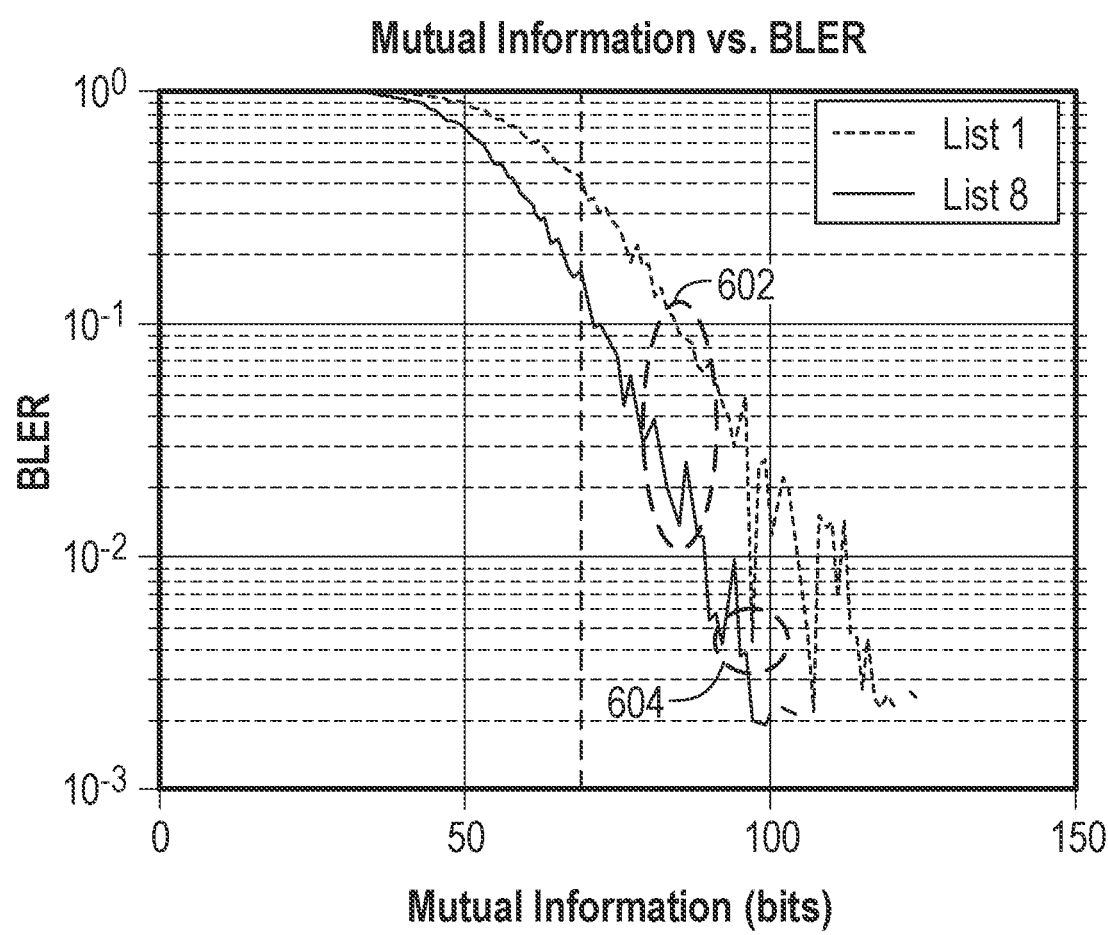
FIG. 6A is a graph depicting example performance of different list sizes used for list decoding.

For example, FIGS. 6A and 6B depict example performances of different list sizes used for list decoding. The available list sizes include List 1 where L=1 (e.g., allowing for 1 decoding path) and List 8 where L=8 (e.g., allowing for 8 decoding paths). Graph 600 in FIG. 6A illustrates different BLER curves for different channel capacity metrics (e.g., mutual information values), where List 1 and List 8 are used. Graph 600 may be specific to a particular payload size for a codeword transmitted via a channel, where the codeword includes a plurality of channel bits encoded with an error-correcting code.

As used herein, channel capacity refers to a maximum rate, in bits per channel use, at which information can be sent with arbitrarily low error probability (e.g., sent through a channel reliably). Channel capacity is equal to a maximum of mutual information between an input and an output of the channel (e.g., where the maximization is with respect to the input distribution). Mutual information quantifies the amount of information shared between the input and the output of the channel, or in other words, measures how much information gets through the channel.

As shown in FIG. 6A (via ellipse 602), when using a list size L=1, the BLER for a mutual information value equal to approximately 80 bits is approximately $10^{-1}$ (or 0.1 or 10%). However, when using a list size L=8, the BLER for the same mutual information value (approximately 80 bits) is approximately 10' (or 0.0112 or 1.12%). As such, a list size L=8 may be better suited for performing a list decoding operation for the codeword transmitted given the BLER is significantly lower (e.g., about 9/o lower). Accordingly, preconfiguring a list decoder with the maximal list size available (e.g., L=8) may achieve a lowest BLER among the list options of L=1 and L=8.

However, as further shown in FIG. 6A (via ellipse 604), when using a list size L=1, the BLER for a mutual information value equal to approximately 95 bits is approximately $10^{-2.5}$ (or 0.0028 or 0.28%), while for a list size L=8, the BLER for the same mutual information value (approximately 95 bits) is approximately $10^{-2.6}$ (or 0.0025 or 0.25%). In this scenario, although the BLER is slightly lower when using a list size L=8, the performance is very close to L=1, and thus preconfiguring a list decoder with the maximal list size available (e.g., L=8) may expend significantly more resources without a proportional improvement in BLER metric.

In particular, as shown in table 650 of FIG. 6B, a list size L=8, for various polar code sizes and for a same payload size (e.g., 60 bits), almost always requires double the amount of decoder cycles (e.g., hardware clock cycles) than list size L=1. For example, for a polar code size equal to 128, 464 decoder cycles are used for list decoding with a list size L=1 while 942 decoder cycles are used for list decoding with a list size L=1 (942/464=2.03). A larger number of decoder cycles corresponds to greater power consumption and resource usage at a receiver performing the list decoding. As such, in the given scenario above where the mutual information value is equal to approximately 95 bits, it may be preferable to use list size L=1 for decoding, although the BLER achieved is 0.0003 less (e.g., a nearly insignificant difference) than the BLER achieved for list size L=8, to significantly reduce power consumption and resource usage at the receiving device. In other words, in some scenarios, the improvement in power consumption and resource may be preferable to the slightly reduced BLER performance.

Accordingly, conventional methods for determining a value of list size, L, for list decoding, such as experimental approaches and/or other approaches where a maximal list size is used, are generally inefficient at balancing performance and resource utilization.

Aspects Related to Resource Efficient List Decoding Operations

In order to overcome technical problems associated with conventional methods of determining a list size, L, for list decoding operations, such as those described above, aspects described herein provide techniques for determining an optimal (e.g., minimal) list size, L, required for successful list decoding. For example, a minimal list size, L, used for list decoding operation enables a receiver to compile a list of potential codewords within a reasonable sized Hamming ball around the received codeword, where the list includes a correct codeword, while also considering (e.g., limiting) computational complexity, resource usage, and power consumption at the receiver. A Hamming ball is a set of all codewords in Hamming space whose Hamming distance (e.g., a number of symbols or positions of two strings that differ with respect to each other) from a received codeword (the "center") does not exceed a Hamming radius of the ball.

Aspects described herein provide techniques for determining a minimal list size, L, for list decoding based on (1) a payload size of a received codeword and (2) a channel capacity metric determined for the received codeword.

Figure 7:
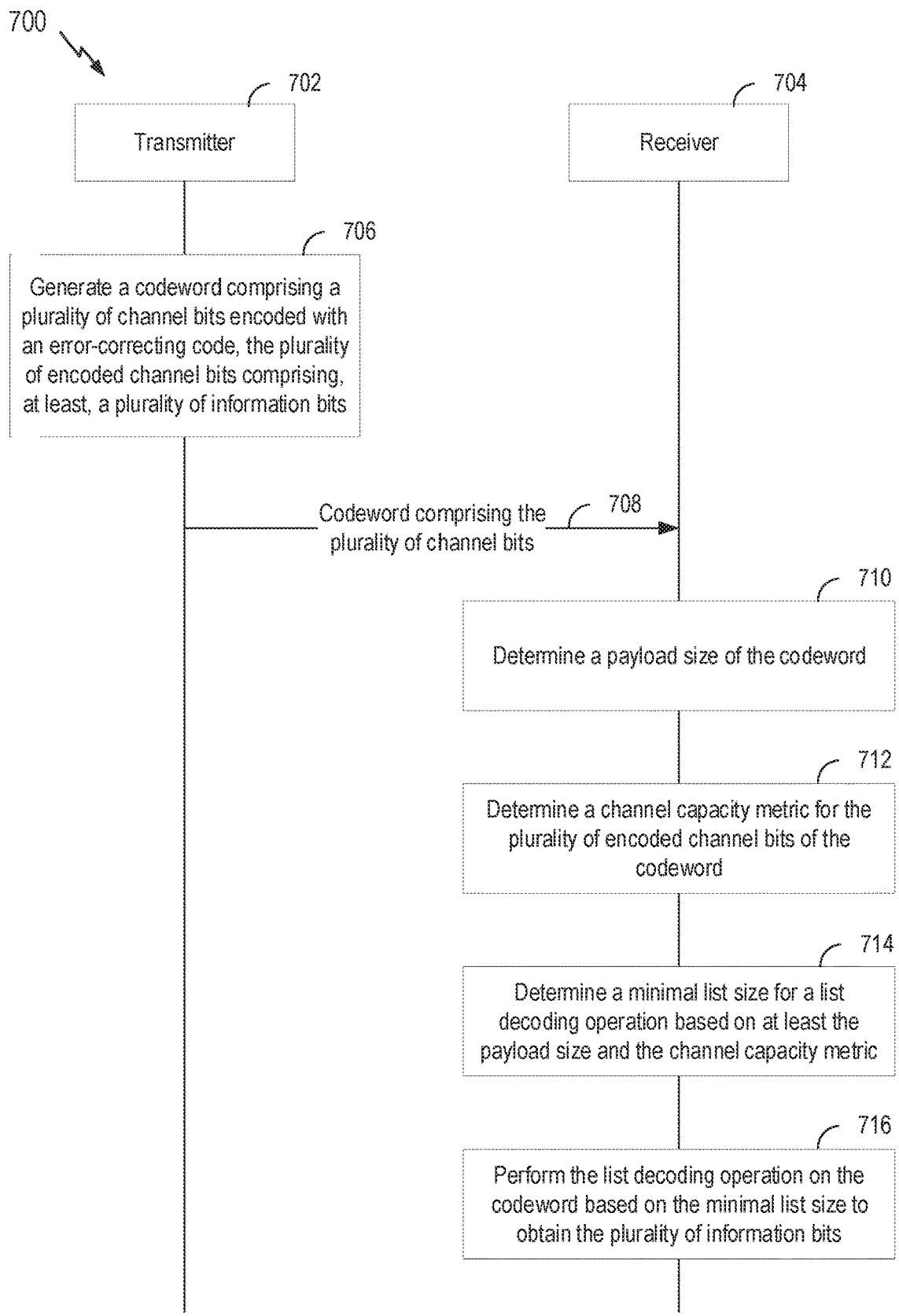
FIG. 7 depicts a process flow for communications in a network between a transmitter and a receiver for performing a list decoding operation.

FIG. 7 depicts a process flow 700 for communications in a network between a transmitter 702 and a receiver 704 for determining a minimal list size, L, based on (1) a payload size of a codeword received by receiver 704 and (2) a channel capacity metric determined for the received codeword. The determined minimal list size, L, is then used to perform a list decoding operation on the received codeword.

In some aspects, transmitter 702 is a network entity, which may be an example of the BS 102 depicted and described with respect to FIGS. 1 and 3 or a disaggregated base station depicted and described with respect to FIG. 2. Alternatively, in some aspects, transmitter 702 is a UE, which may be an example of UE 104 depicted and described with respect to FIGS. 1 and 3. However, in other aspects, the transmitter may be another type of wireless communications device, network entity, or network node, such as those described herein.

In some aspects, receiver 704 is a network entity, which may be an example of the BS 102 depicted and described with respect to FIGS. 1 and 3 or a disaggregated base station depicted and described with respect to FIG. 2. Alternatively, in some aspects, transmitter 702 is a UE, which may be an example of UE 104 depicted and described with respect to FIGS. 1 and 3. However, in other aspects, the transmitter may be another type of wireless communications device, network entity, or network node, such as those described herein.

Process flow 700 begins, at step 706, with transmitter 702 encoding a message (e.g., a plurality of information bits) as a codeword (e.g., a plurality of channel bits) having a plurality of channel bits encoded with an error-correcting code. The plurality of channel bits include at least the plurality of information bits and the redundant bits associated with the error-correcting code. The error-correcting code used to encode the channel bits may be a polar code, a viterbi code, and/or another type of error-correcting code, such as other error-correcting codes described above. A number of information bits included in the codeword is referred to herein as the payload size (e.g., K bits).

As an illustrative example, transmitter 702 may generate a codeword having 432 encoded channel bits (E) encoded using a polar code (E=432 encoded channel bits). The encoded channel bits (E) includes 60 information bits (e.g., Payload Size=K=60 bits).

Process flow 700 proceeds, at step 708, with transmitter 702 transmitting the codeword comprising the plurality of encoded channel bits to receiver 704. Transmitter 702 may transmit the plurality of encoded channel bits over a plurality of symbols. One channel bit may be transmitted per symbol (e.g., where the number of encoded channel bits=the number of symbols) or two or more channel bits may be transmitted per symbol. A number of channel bits transmitted per symbol may be based on the modulation used (e.g., quadrature amplitude modulation). For example, where quadrature phase shift keying (QPSK) modulation is used, each symbol may convey two channel bits.

For the above example, transmitter 702 transmits the 432 encoded channel bits over 216 symbols. In particular, each symbol of the 216 symbols are used to transmit 2 encoded channel bits (e.g., 2 encoded channel bits*216 symbols=432 encoded channel bits).

To decode the received codeword and thereby determine the information bits (e.g., the message intended for receiver 704) included in the received codeword, receiver 704 may be configured to perform list decoding. More specifically, a list mode decoder may be implemented by receiver 704 to output a list of potential codewords that differ from the received codeword in a certain number of positions. The list mode decoder may perform list decoding according to a determined minimal list size, L, or in other words, the list mode decoder may concurrently process L candidate decoding paths when performing a list decoding operation for the received codeword.

To determine the minimal list size, receiver 704 performs steps 710-714 in process flow 700. For example, at step 710, receiver 704 determines a payload size of the received codeword. The payload size may be pre-configured by transmitter 702 (e.g., as described above, transmitter 702 may be a network entity). Because the payload size is pre-configured, the payload size may be known to receiver 704.

Process flow 700 then proceeds, at step 712, with receiver 704 determining a channel capacity metric for the plurality of encoded channel bits of the received codeword. The channel capacity metric may be a mutual information value, an LLR-based projection, a signal to noise ratio (SNR)-based projection, and/or the like.

For example, in some aspects, determining the channel capacity metric at step 712 involves determining a mutual information value for the plurality of encoded channel bits of the received codeword. For example, to determine the mutual information value, as a first step, an LLR (also referred to herein as an "LLR statistic") is calculated for each symbol. More specifically, an LLR is calculated for one or more bits of the plurality of channel bits transmitted in each symbol used to transmit the plurality of channel bits (e.g., from transmitter 702 to receiver 704). As such, for the above example, where the channel bits are transmitted over 216 symbols, 432 LLRs are calculated (e.g., for the QPSK case).

An LLR is a statistic expressing the relative log likelihood of some data given two competing models. The LLR (also referred to herein as the "likelihood ratio statistic") can be written as:

$$LLR = \log\left(\frac{L(\theta_0)}{L(\theta_\alpha)}\right)$$

where, $L(\theta_0)$ is the likelihood of a null hypothesis ($H_0$: $\theta=\theta_0$) being correct, and $L(\theta_\alpha)$ is the likelihood of an alternate hypothesis ($H_\alpha$: $\theta=\theta_\alpha$) being correct. A null hypothesis ($H_0$: $\theta=\theta_0$) is a statement about a population that is assumed to be true unless it can be shown to be incorrect, while an alternate hypothesis ($H_\alpha$: $\theta=\theta_\alpha$) is a claim about the population that is contradictory to $H_0$ and is concluded when $H_0$ is rejected.

In this case, the likelihood of a null hypothesis being correct is equal to p (e.g., $L(\theta_0)=p$), where p is the probability of receiving one or more channel bits transmitted in a particular symbol. Further, the likelihood of an alternate hypothesis being correct is equal to 1−p (e.g., $L(\theta_\alpha)=1-p$), where 1−p is the probability of not receiving the one or more channel bits transmitted in the particular symbol. Accordingly, the LLR calculated for each symbol can be written as:

$$LLR = \log\left(\frac{p}{1-p}\right)$$

The LLR calculated for each symbol represents the confidence that the received bit(s) is 1 or 0 (or the confidence that the received bit(s) is correct or flipped). At a second step for determining the mutual information value, a mutual information per bit value (e.g., an example of a channel capacity per bit value) is calculated for each bit of the transmitted encoded channel bits. For the above example, this means that 432 mutual information per bit values are calculated given 432 channel bits were transmitted between transmitter 702 and receiver 704. The mutual information per bit value can be written as:

$$MI \text{ per bit} = 1 - [-P_e \cdot \log_2(P_e) - (1-P_e) \cdot \log_2(1-P_e)] \text{ where}$$

$$P_e = \frac{1}{1 + e^{-|LLR|}}$$

and the LLR is the LLR calculated for a symbol where the particular channel bit (for which the MI per bit value is being calculated) was transmitted. Here, variable $P_e$ represents the probability of error.

At a third step for determining the mutual information value, the mutual information value is calculated as the sum of the mutual information per bit values calculated for each bit of the plurality of encoded bits (at step 2). For example, the mutual information value (MI) may be written as:

$$MI = \sum_{i=0}^{E-1} \left(1 - \left[-P_{e_i} \cdot \log_2(P_{e_i}) - (1-P_{e_i}) \cdot \log_2(1-P_{e_i})\right]\right)$$

where E is the number of transmitted encoded channel bits (e.g., assuming an ideal channel coding). The MI summation (shown in the equation above) is over E probabilities given the number of transmitted encoded channel bits, E, is less than the polar size, N (e.g., E<N). For the above example, E is equal to 432 bits given 432 encoded channel bits were transmitted from transmitter 702 to receiver 704. The number of encoded channel bits (E) may be pre-configured by transmitter 702 (e.g., as described above, transmitter 702 may be a network entity). Because the number of encoded channel bits (E) is pre-configured, the number of encoded channel bits may be known to receiver 704. Additionally, the polar size (N) for this example is equal to 512, as such the above MI summation equation is used to calculate the mutual information value.

Alternatively, in cases where the number of transmitted encoded channel bits, E, is greater than the polar size, N (e.g., E>N), repetition is used. As such, the receiver side may perform de-repetition of the E transmitted encoded channel bits LLRs into N LLRs prior to the probability calculation. In this case, the summation is performed over N MI metrics.

The calculated mutual information value (MI) may indicate a number of information bits that may be conveyed through the given channel used to transmit the codeword to receiver 704.

For the above example, the maximum mutual information value may be equal to the number of encoded channel bits (E). The mutual information value calculated for the 432 encoded channel bits however is equal to 145 information bits (e.g., MI=145 information bits<432 encoded channel bits).

Process flow 700 then proceeds, at step 714, with receiver 704 determining the minimal list size to use for the list decoding operation based on at least the payload size (e.g., determined at step 710) and the channel capacity metric (e.g., determined at step 712). For example, to determine the minimal list size at step 714, receiver 704 may first determine a plurality of candidate list sizes available for the decoding operation. For example, candidate list sizes may be list sizes which the list mode decoder of receiver 704 is configured to use for performing the list decoding operation. For this example, the list mode decoder may be configured to use a list size L=1 or a list size L=8.

Second, receiver 704 may determine a range of channel capacity metrics (e.g., a range of MI values) associated with each of the plurality of candidate list sizes for the determined payload size. In some aspects, receiver 704 determines the channel capacity metric ranges associated with different candidate list sizes based on previously-generated characterizations (e.g., performance graphs or tables, such as, for example, the graph and table illustrated in FIGS. 6A and 6B, respectively) for different payload sizes. In particular, a BLER vs. channel capacity metric graph for different list sizes may have been previously generated for each possible payload size, for example, via lab testing. For example, a first BLER vs. channel capacity metric graph may have been previously created for a first payload size of 60 bits, a second BLER vs. channel capacity metric graph may have been previously created for a second payload size of 65 bits, a third BLER vs. channel capacity metric graph may have been previously created for a third payload size of 70 bits, and so on. These graphs may have an x-axis representing different channel capacity metric values and a y-axis representing different BLER values (e.g., similar to the graph in FIG. 6A). Various BLER curves provided via each graph may correspond to different list sizes used for list decoding for a payload size associated with the respective graph.

Figure 8:
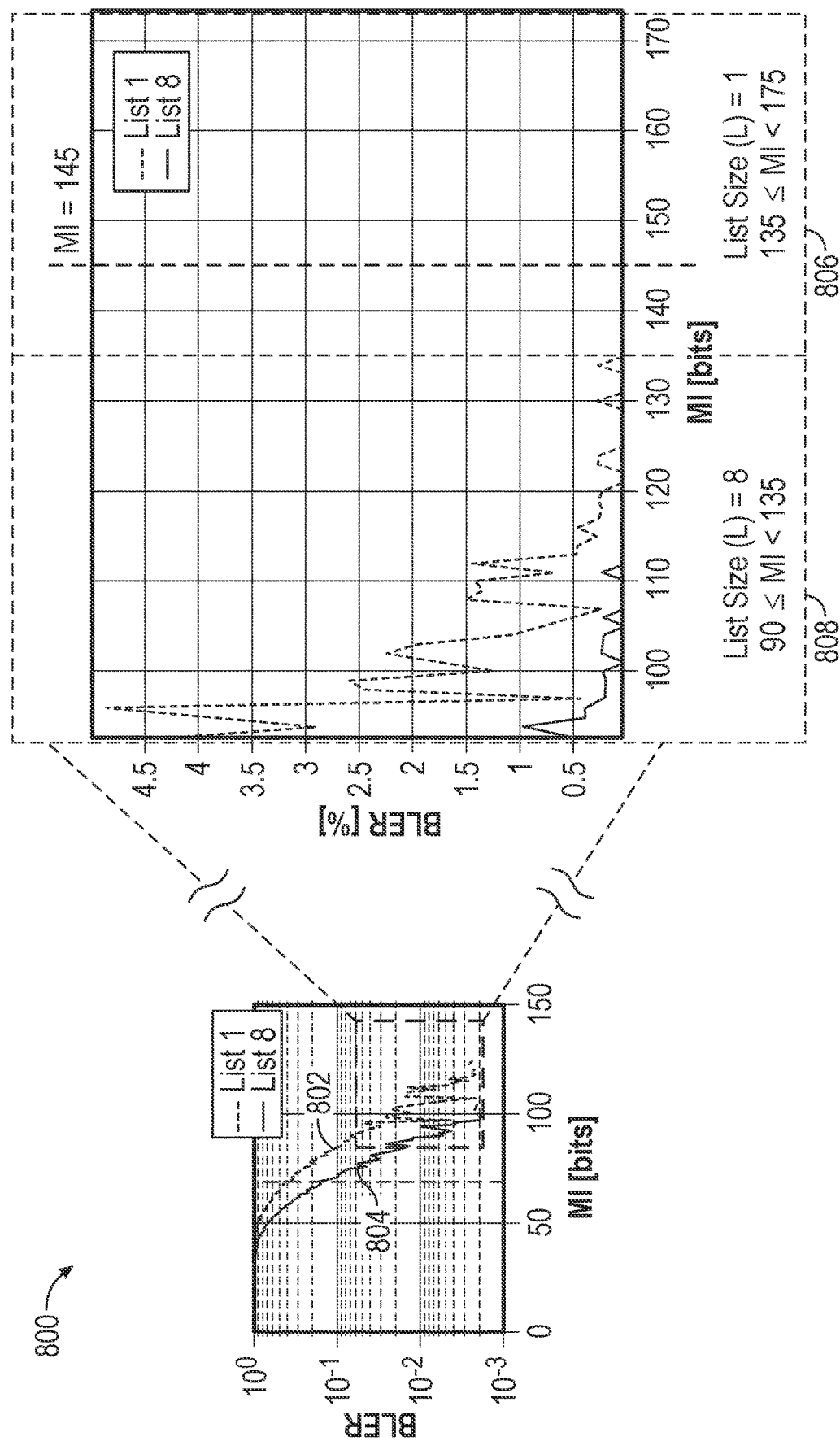
FIG. 8 depicts an example block error rate vs. channel capacity metric graph for a payload size of sixty bits.

An example BLER vs. channel capacity metric graph 800 (simply referred to herein as "graph 800") is illustrated in FIG. 8 (e.g., graph 800 is the same BLER vs. channel capacity metric graph previously described with respect to FIG. 6A, but with a portion of the graph emphasized for further discussion). Graph 800 includes two BLER curves: a first BLER curve 802 corresponding to a list size L=1 and a second BLER curve 804 corresponding to a list size L=8. First BLER curve 802 indicates expected BLER values for different mutual information values (e.g., example channel capacity metrics) when list size L=1 is used for performing list decoding operations for a payload size of sixty bits (e.g., based on lab data). Similarly, second BLER curve 804 indicates expected BLER values for different mutual information values when list size L=8 is used for performing list decoding operations for a same payload size of 60 bits. While graph 800 is associated with an example payload size equal to 60 bits, other graphs may have been similarly generated for other payload sizes. Further, while graph 800 provides an x-axis for different mutual information values, other graphs may include different channel capacity metrics for the x-axis.

As depicted in graph 800, there exists a first portion 806 of first BLER curve 802 where the BLER is equal to 0%. For example, between 135 information bits and 175 information bits (e.g., 135 bits<MI≤175 bits), a BLER equal to 0% may be achieved when using the list size L=1 for performing list decoding operations. As used herein, channel capacity metrics 135-175 bits are referred to as "a range of channel capacity metrics" associated with list size L=1 and a payload size of sixty bits. Similarly, a range of channel capacity metrics associated with list size L=8 and a payload size of 60 bits includes channel capacity metrics 90-135 bits (e.g., 90 bits<MI≤135 bits as shown via second portion 808 of second BLER curve 804.

Accordingly, using the payload size of 60 bits (e.g., determined at step 710), graph 800 may be selected. Further, using the determined channel capacity metric (e.g., determined at 712), receiver 704 may determine to use list size L=1 (e.g., determine that list size L=1 is the minimal list size, $L_{min}$). Specifically, because the channel capacity metric, MI=140 information bits, is within the channel capacity range associated with list size L=1 (for a payload size of sixty bits) (e.g., 135 bits<MI≤175 bits), receiver 704 determines to use list size L=1 instead of L=8 for performing a list decoding operation on the received codeword.

Process flow 700 then proceeds, at step 716, with receiver 704 performing the list decoding operation on the received codeword based on the minimal list size to obtain the plurality of information bits. Performing the list decoding operation based on the minimal list size involves selecting a maximum number of decoding paths equal to the minimal list size, in this case, one decoding path.

Accordingly, power consumption and resource usage at receiver 704 may be reduced (each beneficial technical effects) by determining the minimal list size, L, instead of using a maximal list size as done in some conventional methods. Moreover, the minimal list size, $L_{min}$, still allows for achieving reliable communications (e.g., allows for achieving a BLER of 0% in this example), Thus, reliability is not sacrificed as a result of using the minimal list size.

It is noted that while graphs (e.g., such as graph 800 in FIG. 8) and tables are convenient representations for determining a minimal list size for decoding operations, other data representations may be used. For example, a function $f(x)$ where x is the determined channel capacity metric, a look-up table with channel capacity metric ranges may be used, etc.

Example Operations

Figure 9:
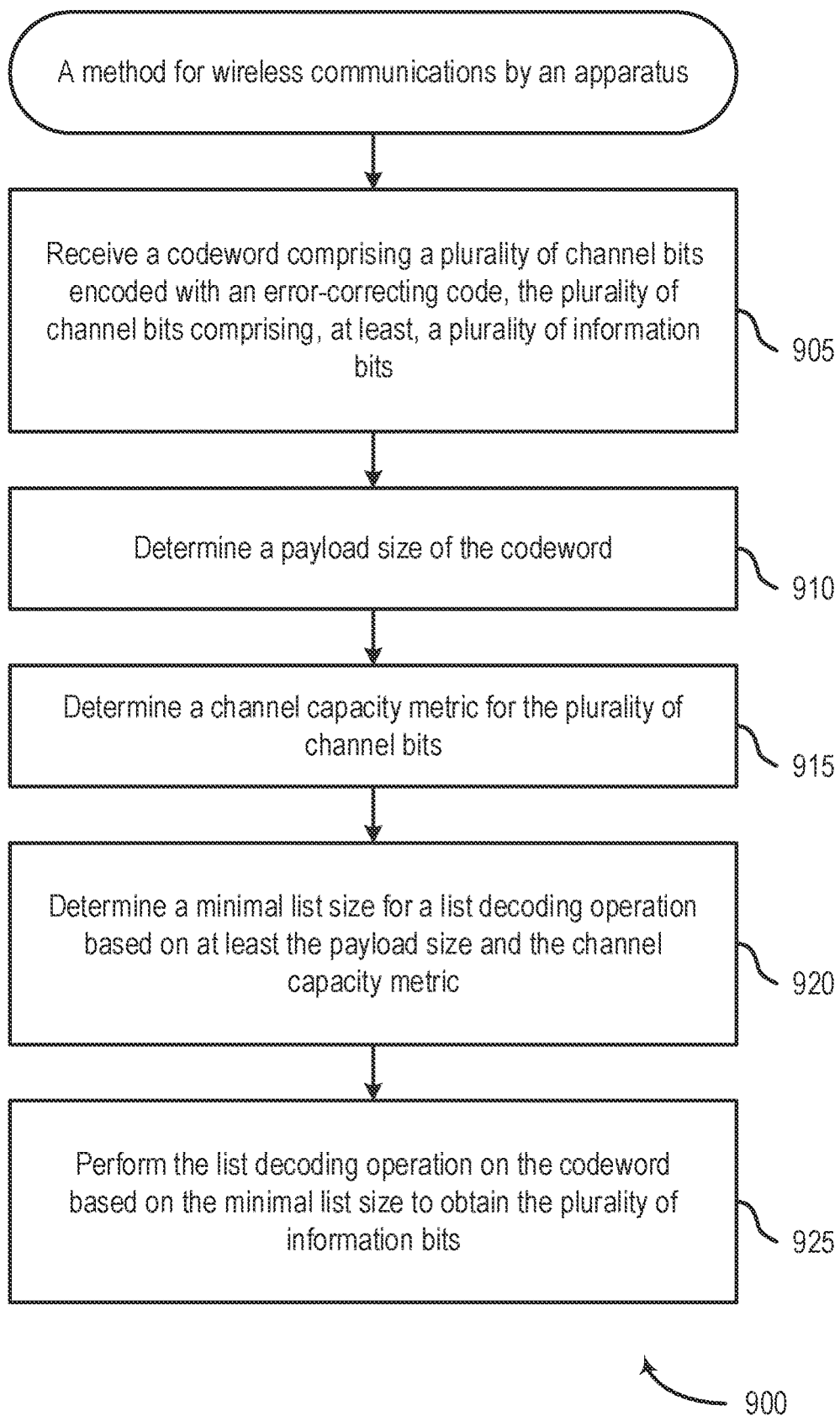
FIG. 9 depicts a method for wireless communications.

FIG. 9 shows a method 900 of wireless communications by an apparatus, such as UE 104 of FIGS. 1 and 3, BS 102 of FIGS. 1 and 3, or a disaggregated base station discussed with respect to FIG. 2.

Method 900 begins at step 905 with receiving a codeword comprising a plurality of channel bits encoded with an error-correcting code, the plurality of channel bits comprising, at least, a plurality of information bits.

Method 900 then proceeds to step 910 with determining a payload size of the codeword.

Method 900 then proceeds to step 915 with determining a channel capacity metric for the plurality of channel bits.

Method 900 then proceeds to step 920 with determining a minimal list size for a list decoding operation based on at least the payload size and the channel capacity metric.

Method 900 then proceeds to step 925 with performing the list decoding operation on the codeword based on the minimal list size to obtain the plurality of information bits.

In certain aspects, step 920 includes determining a plurality of candidate list sizes for the list decoding operation.

In certain aspects, step 920 includes, for the determined payload size, determining a range of channel capacity metrics associated with each of the plurality of candidate list sizes, wherein the range of channel capacity metrics associated with each of the plurality of candidate list sizes are non-overlapping.

In certain aspects, step 920 includes identifying a candidate list size, from the plurality of candidate list sizes, as the minimal list size based on the channel capacity metric determined for the plurality of channel bits falling within the range of channel capacity metrics associated with the candidate list size.

In certain aspects, method 900 further includes receiving the plurality of channel bits over a plurality of symbols.

In certain aspects, step 915 includes, for each respective symbol of the plurality of symbols, calculating a log-likelihood ratio for one or more bits of the plurality of channel bits transmitted in the respective symbol.

In certain aspects, step 915 includes, for each respective bit of the plurality of channel bits, calculating a channel capacity per bit value for the respective bit based on the log-likelihood ratio calculated for the symbol transmitting the respective bit.

In certain aspects, step 915 includes summing the channel capacity per bit value calculated for each bit of the plurality of channel bits to determine the channel capacity metric.

In certain aspects, the channel capacity metric comprises a mutual information value.

In certain aspects, the error-correcting code comprises a polar code.

In certain aspects, the error-correcting code comprises a viterbi code.

In certain aspects, step 925 includes selecting a number of decoding paths equal to the minimal list size.

Figure 10:
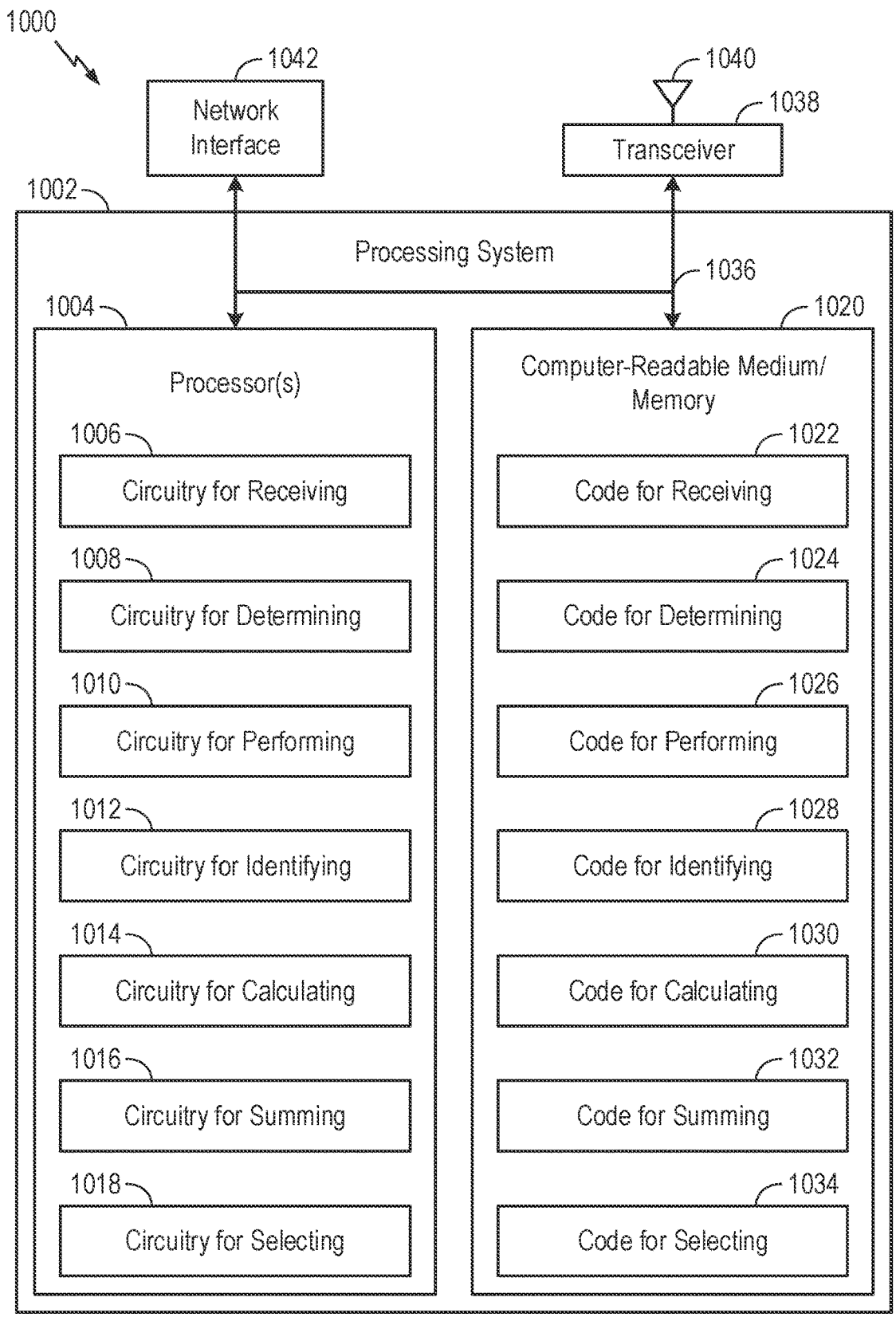
FIG. 10 depicts aspects of an example communications device.

In certain aspects, method 900, or any aspect related to it, may be performed by an apparatus, such as communications device 1000 of FIG. 10, which includes various components operable, configured, or adapted to perform the method 900. Communications device 1000 is described below in further detail.

Note that FIG. 9 is just one example of a method, and other methods including fewer, additional, or alternative steps are possible consistent with this disclosure.

Example Communications Device

FIG. 10 depicts aspects of an example communications device 1000. In some aspects, communications device 1000 is a user equipment, such as UE 104 described above with respect to FIGS. 1 and 3. In some aspects, communications device 1000 is a network entity, such as BS 102 of FIGS. 1 and 3, or a disaggregated base station as discussed with respect to FIG. 2.

The communications device 1000 includes a processing system 1002 coupled to a transceiver 1038 (e.g., a transmitter and/or a receiver) and/or a network interface 1042. The transceiver 1038 is configured to transmit and receive signals for the communications device 1000 via an antenna 1040, such as the various signals as described herein. The network interface 1042 is configured to obtain and send signals for the communications device 1000 via communications link(s), such as a backhaul link, midhaul link, and/or fronthaul link as described herein, such as with respect to FIG. 2. The processing system 1002 may be configured to perform processing functions for the communications device 1000, including processing signals received and/or to be transmitted by the communications device 1000.

The processing system 1002 includes one or more processors 1004. In various aspects, the one or more processors 1004 may be representative of one or more of receive processor 338, receive processor 358, transmit processor 320, transmit processor 364, TX MIMO processor 330, TX MIMO processor 366, controller/processor 340, and/or controller/processor 380, as described with respect to FIG. 3. The one or more processors 1004 are coupled to a computer-readable medium/memory 1020 via a bus 1036. In certain aspects, the computer-readable medium/memory 1020 is configured to store instructions (e.g., computer-executable code) that when executed by the one or more processors 1004, enable and cause the one or more processors 1004 to perform the method 900 described with respect to FIG. 9, or any aspect related to it, including any additional steps or sub-steps described in relation to FIG. 9. Note that reference to a processor performing a function of communications device 1000 may include one or more processors performing that function of communications device 1000, such as in a distributed fashion.

In the depicted example, computer-readable medium/memory 1020 stores code for receiving 1022, code for determining 1024, code for performing 1026, code for identifying 1028, code for calculating 1030, code for summing 1032, and code for selecting 1034. Processing of the code 1022-1034 may enable and cause the communications device 1000 to perform the method 900 described with respect to FIG. 9, or any aspect related to it.

The one or more processors 1004 include circuitry configured to implement (e.g., execute) the code stored in the computer-readable medium/memory 1020, including circuitry for receiving 1006, circuitry for determining 1008, circuitry for performing 1010, circuitry for identifying 1012, circuitry for calculating 1014, circuitry for summing 1016, and circuitry for selecting 1018. Processing with circuitry 1006-1018 may enable and cause the communications device 1000 to perform the method 900 described with respect to FIG. 9, or any aspect related to it.

More generally, means for communicating, transmitting, sending or outputting for transmission may include: the transceivers 332, antenna(s) 334, transmit processor 320, TX MIMO processor 330, and/or controller/processor 340 of the BS 102 illustrated in FIG. 3; the transceivers 354, antenna(s) 352, transmit processor 364, TX MIMO processor 366, and/or controller/processor 380 of the UE 104 illustrated in FIG. 3; transceiver 1038 and/or antenna 1040 of the communications device 1000 in FIG. 10; and/or one or more processors 1004 of the communications device 1000 in FIG. 10. Means for communicating, receiving or obtaining may include: the transceivers 332, antenna(s) 334, receive processor 338, and/or controller/processor 340 of the BS 102 illustrated in FIG. 3; the transceivers 354, antenna(s) 352, receive processor 358, and/or controller/processor 380 of the UE 104 illustrated in FIG. 3; transceiver 1038 and/or antenna 1040 of the communications device 1000 in FIG. 10; and/or one or more processors 1004 of the communications device 1000 in FIG. 10.

Example Clauses

Implementation examples are described in the following numbered clauses:

Clause 1: A method for wireless communications by an apparatus, comprising: receiving a codeword comprising a plurality of channel bits encoded with an error-correcting code, the plurality of channel bits comprising, at least, a plurality of information bits; determining a payload size of the codeword; determining a channel capacity metric for the plurality of channel bits; determining a minimal list size for a list decoding operation based on at least the payload size and the channel capacity metric; and performing the list decoding operation on the codeword based on the minimal list size to obtain the plurality of information bits.

Clause 2: The method of Clause 1, wherein determining the minimal list size for the list decoding operation based on at least the payload size and the channel capacity metric comprises: determining a plurality of candidate list sizes for the list decoding operation; for the determined payload size, determining a range of channel capacity metrics associated with each of the plurality of candidate list sizes, wherein the range of channel capacity metrics associated with each of the plurality of candidate list sizes are non-overlapping; and identifying a candidate list size, from the plurality of candidate list sizes, as the minimal list size based on the channel capacity metric determined for the plurality of channel bits falling within the range of channel capacity metrics associated with the candidate list size.

Clause 3: The method of Clause 2, further comprising receiving the plurality of channel bits over a plurality of symbols.

Clause 4: The method of Clause 3, wherein determining the channel capacity metric for the plurality of channel bits comprises: for each respective symbol of the plurality of symbols, calculating a log-likelihood ratio for one or more bits of the plurality of channel bits transmitted in the respective symbol; for each respective bit of the plurality of channel bits, calculating a channel capacity per bit value for the respective bit based on the log-likelihood ratio calculated for the symbol transmitting the respective bit; and summing the channel capacity per bit value calculated for each bit of the plurality of channel bits to determine the channel capacity metric.

Clause 5: The method of any one of Clauses 1-4, wherein the channel capacity metric comprises a mutual information value.

Clause 6: The method of any one of Clauses 1-5, wherein the error-correcting code comprises a polar code.

Clause 7: The method of any one of Clauses 1-6, wherein the error-correcting code comprises a viterbi code.

Clause 8: The method of any one of Clauses 1-7, wherein performing the list decoding operation based on the minimal list size comprises selecting a number of decoding paths equal to the minimal list size.

Clause 9: One or more apparatuses, comprising: one or more memories comprising executable instructions; and one or more processors configured to execute the executable instructions and cause the one or more apparatuses to perform a method in accordance with any one of clauses 1-8.

Clause 10: One or more apparatuses, comprising means for performing a method in accordance with any one of clauses 1-8.

Clause 11: One or more non-transitory computer-readable media comprising executable instructions that, when executed by one or more processors of one or more apparatuses, cause the one or more apparatuses to perform a method in accordance with any one of clauses 1-8.

Clause 12: One or more computer program products embodied on one or more computer-readable storage media comprising code for performing a method in accordance with any one of clauses 1-8.

Additional Considerations

The preceding description is provided to enable any person skilled in the art to practice the various aspects described herein. The examples discussed herein are not limiting of the scope, applicability, or aspects set forth in the claims. Various modifications to these aspects will be readily apparent to those skilled in the art, and the general principles defined herein may be applied to other aspects. For example, changes may be made in the function and arrangement of elements discussed without departing from the scope of the disclosure. Various examples may omit, substitute, or add various procedures or components as appropriate. For instance, the methods described may be performed in an order different from that described, and various actions may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, a system on a chip (SoC), or any other such configuration.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, "coupled to" and "coupled with" generally encompass direct coupling and indirect coupling (e.g., including intermediary coupled aspects) unless stated otherwise. For example, stating that a processor is coupled to a memory allows for a direct coupling or a coupling via an intermediary aspect, such as a bus.

The methods disclosed herein comprise one or more actions for achieving the methods. The method actions may be interchanged with one another without departing from the scope of the claims. In other words, unless a specific order of actions is specified, the order and/or use of specific actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor.

The following claims are not intended to be limited to the aspects shown herein, but are to be accorded the full scope consistent with the language of the claims. Reference to an element in the singular is not intended to mean only one unless specifically so stated, but rather "one or more." For example, reference to an element (e.g., "a processor," "a controller," "a memory," etc.), unless otherwise specifically stated, should be understood to refer to one or more elements (e.g., "one or more processors," "one or more controllers," "one or more memories," etc.). The terms "set" and "group" are intended to include one or more elements, and may be used interchangeably with "one or more." Where reference is made to one or more elements performing functions (e.g., steps of a method), one element may perform all functions, or more than one element may collectively perform the functions. When more than one element collectively performs the functions, each function need not be performed by each of those elements (e.g., different functions may be performed by different elements) and/or each function need not be performed in whole by only one element (e.g., different elements may perform different sub-functions of a function). Similarly, where reference is made to one or more elements configured to cause another element (e.g., an apparatus) to perform functions, one element may be configured to cause the other element to perform all functions, or more than one element may collectively be configured to cause the other element to perform the functions. Unless specifically stated otherwise, the term "some" refers to one or more. All structural and functional equivalents to the elements of the various aspects described throughout this disclosure that are known or later come to be known to those of ordinary skill in the art are intended to be encompassed by the claims. Moreover, nothing disclosed herein is intended to be dedicated to the public regardless of whether such disclosure is explicitly recited in the claims.

What is claimed is:

1. An apparatus configured for wireless communications, comprising:
   one or more memories comprising processor-executable instructions; and
   one or more processors configured to execute the processor-executable instructions and cause the apparatus to:
     receive a codeword comprising a plurality of channel bits encoded with an error-correcting code, the plurality of channel bits comprising, at least, a plurality of information bits;
     determine a payload size of the codeword;
     determine a channel capacity metric for the plurality of channel bits;
     determine a minimal list size for a list decoding operation based on at least the payload size and the channel capacity metric; and
     perform the list decoding operation on the codeword based on the minimal list size to obtain the plurality of information bits.

2. The apparatus of claim 1, wherein to determine the minimal list size for the list decoding operation based on at least the payload size and the channel capacity metric, the one or more processors are configured to execute the processor-executable instructions and cause the apparatus to:
   determine a plurality of candidate list sizes for the list decoding operation;
   for the determined payload size, determine a range of channel capacity metrics associated with each of the plurality of candidate list sizes, wherein the range of channel capacity metrics associated with each of the plurality of candidate list sizes do not overlap; and
   identify a candidate list size, from the plurality of candidate list sizes, as the minimal list size based on the channel capacity metric determined for the plurality of channel bits that fall within the range of channel capacity metrics associated with the candidate list size.

3. The apparatus of claim 2, wherein the one or more processors are configured to execute the processor-executable instructions and cause the apparatus to receive the plurality of channel bits over a plurality of symbols.

4. The apparatus of claim 3, wherein to determine the channel capacity metric for the plurality of channel bits, the one or more processors are configured to execute the processor-executable instructions and cause the apparatus to:
   for each respective symbol of the plurality of symbols, calculate a log-likelihood ratio for one or more bits of the plurality of channel bits transmitted in the respective symbol;
   for each respective bit of the plurality of channel bits, calculate a channel capacity per bit value for the respective bit based on the log-likelihood ratio calculated for the symbol associated with the respective bit; and
   sum the channel capacity per bit value calculated for each bit of the plurality of channel bits to determine the channel capacity metric.

5. The apparatus of claim 1, wherein the channel capacity metric comprises a mutual information value.

6. The apparatus of claim 1, wherein the error-correcting code comprises a polar code.

7. The apparatus of claim 1, wherein the error-correcting code comprises a viterbi code.

8. The apparatus of claim 1, wherein to perform the list decoding operation based on the minimal list size, the one or more processors are configured to execute the processor-executable instructions and cause the apparatus to select a number of decoding paths equal to the minimal list size.

9. A method for wireless communications by an apparatus, comprising:
   receiving a codeword comprising a plurality of channel bits encoded with an error-correcting code, the plurality of channel bits comprising, at least, a plurality of information bits;
   determining a payload size of the codeword;
   determining a channel capacity metric for the plurality of channel bits;
   determining a minimal list size for a list decoding operation based on at least the payload size and the channel capacity metric; and
   performing the list decoding operation on the codeword based on the minimal list size to obtain the plurality of information bits.

10. The method of claim 9, wherein determining the minimal list size for the list decoding operation based on at least the payload size and the channel capacity metric comprises:
    determining a plurality of candidate list sizes for the list decoding operation;
    for the determined payload size, determining a range of channel capacity metrics associated with each of the plurality of candidate list sizes, wherein the range of channel capacity metrics associated with each of the plurality of candidate list sizes do not overlap; and
    identifying a candidate list size, from the plurality of candidate list sizes, as the minimal list size based on the channel capacity metric determined for the plurality of channel bits that fall within the range of channel capacity metrics associated with the candidate list size.

11. The method of claim 10, further comprising receiving the plurality of channel bits over a plurality of symbols.

12. The method of claim 11, wherein determining the channel capacity metric for the plurality of channel bits comprises:
    for each respective symbol of the plurality of symbols, calculating a log-likelihood ratio for one or more bits of the plurality of channel bits transmitted in the respective symbol;
    for each respective bit of the plurality of channel bits, calculating a channel capacity per bit value for the respective bit based on the log-likelihood ratio calculated for the symbol associated with the respective bit; and
    summing the channel capacity per bit value calculated for each bit of the plurality of channel bits to determine the channel capacity metric.

13. The method of claim 9, wherein the channel capacity metric comprises a mutual information value.

14. The method of claim 9, wherein the error-correcting code comprises a polar code.

15. The method of claim 9, wherein the error-correcting code comprises a viterbi code.

16. The method of claim 9, wherein performing the list decoding operation based on the minimal list size comprises selecting a number of decoding paths equal to the minimal list size.

17. One or more non-transitory computer-readable media comprising executable instructions that, when executed by one or more processors of an apparatus, cause the apparatus to perform operations comprising:

receiving a codeword comprising a plurality of channel bits encoded with an error-correcting code, the plurality of channel bits comprising, at least, a plurality of information bits;

determining a payload size of the codeword;

determining a channel capacity metric for the plurality of channel bits;

determining a minimal list size for a list decoding operation based on at least the payload size and the channel capacity metric; and performing the list decoding operation on the codeword based on the minimal list size to obtain the plurality of information bits.

18. The one or more non-transitory computer-readable media of claim 17, wherein determining the minimal list size for the list decoding operation based on at least the payload size and the channel capacity metric comprises:

determining a plurality of candidate list sizes for the list decoding operation;

for the determined payload size, determining a range of channel capacity metrics associated with each of the plurality of candidate list sizes, wherein the range of channel capacity metrics associated with each of the plurality of candidate list sizes do not overlap; and identifying a candidate list size, from the plurality of candidate list sizes, as the minimal list size based on the channel capacity metric determined for the plurality of channel bits that fall within the range of channel capacity metrics associated with the candidate list size.

19. The one or more non-transitory computer-readable media of claim 18, wherein the operations further comprise receiving the plurality of channel bits over a plurality of symbols.

20. The one or more non-transitory computer-readable media of claim 19, wherein determining the channel capacity metric for the plurality of channel bits comprises:

for each respective symbol of the plurality of symbols, calculating a log-likelihood ratio for one or more bits of the plurality of channel bits transmitted in the respective symbol;

for each respective bit of the plurality of channel bits, calculating a channel capacity per bit value for the respective bit based on the log-likelihood ratio calculated for the symbol associated with the respective bit; and summing the channel capacity per bit value calculated for each bit of the plurality of channel bits to determine the channel capacity metric.

* * * * *